(12) United States Patent
Poddar et al.

(10) Patent No.: US 9,094,133 B2
(45) Date of Patent: Jul. 28, 2015

(54) INTEGRATED PRODUCTION OF SELF INJECTION LOCKED SELF PHASE LOOP LOCKED OPTOELECTRONIC OSCILLATOR

(71) Applicant: Synergy Microwave Corporation, Paterson, NJ (US)

(72) Inventors: Ajay Kumar Poddar, Elmwood Park, NJ (US); Ulrich L. Rohde, Upper Saddle River, NJ (US); Afshin S. Daryoush, Bryn Mawr, PA (US)

(73) Assignee: Synergy Microwave Corporation, Paterson, NJ (US)

( * ) Notice: Subject to any disclaimer, the term of this patent is extended or adjusted under 35 U.S.C. 154(b) by 120 days.

(21) Appl. No.: 13/796,446

(22) Filed: Mar. 12, 2013

(65) Prior Publication Data

US 2014/0270786 A1  Sep. 18, 2014

(51) Int. Cl.
*H04B 10/508*  (2013.01)
*H04B 10/00*  (2013.01)
*H04B 10/04*  (2006.01)
*H04B 10/61*  (2013.01)
*G02F 1/00*  (2006.01)
*H03B 17/00*  (2006.01)
*H04B 10/50*  (2013.01)

(52) U.S. Cl.
CPC  *H04B 10/61* (2013.01); *G02F 1/00* (2013.01); *H03B 17/00* (2013.01); *H04B 10/50* (2013.01)

(58) Field of Classification Search
CPC .. G02B 6/2861; G02B 6/4215; H04B 10/505; H04B 10/5053
USPC .................. 398/115, 116, 161, 194
See application file for complete search history.

(56) References Cited

U.S. PATENT DOCUMENTS

| 4,048,580 A | 9/1977 | Campbell et al. |
| 4,336,505 A | 6/1982 | Meyer |
| 4,980,891 A * | 12/1990 | Izadpanah ...................... 372/25 |
| 5,204,640 A | 4/1993 | Logan, Jr. |
| 5,220,292 A | 6/1993 | Bianchini et al. |
| 5,379,309 A | 1/1995 | Logan, Jr. |

(Continued)

FOREIGN PATENT DOCUMENTS

| EP | 1600806 A2 | 11/2005 |
| EP | 2144370 A1 | 1/2010 |

(Continued)

OTHER PUBLICATIONS

Yao et al., "High frequency optical subcarrier generator", Electronics Letters, vol. 30, No. 18, Sep. 1, 1994, pp. 1525-1526.

(Continued)

*Primary Examiner* — Oommen Jacob
(74) *Attorney, Agent, or Firm* — Lerner, David, Littenberg, Krumholz & Mentlik, LLP

(57) ABSTRACT

The present invention details fabrication guidelines of integrated optoelectronic oscillators with frequency and phase stability, having higher frequency selectivity in a relatively small size (compared to the larger size of a higher order electrically realized RF filter), reduced temperature sensitivity, and minimized frequency drift. The integrated photonic components and RF oscillator may use Silicon photonics and microelectronic integration using CMOS and BiCMOS technology, eliminating the need for bulky and/or discrete optical and microwave components.

29 Claims, 12 Drawing Sheets

(56) References Cited

U.S. PATENT DOCUMENTS

| | | | |
|---|---|---|---|
| 5,396,166 A * | 3/1995 | Vohra et al. | 324/96 |
| 5,457,559 A * | 10/1995 | Saito et al. | 398/98 |
| 5,687,261 A | 11/1997 | Logan | |
| 5,706,113 A * | 1/1998 | Kawanishi et al. | 398/212 |
| 5,777,778 A | 7/1998 | Yao | |
| 5,917,179 A | 6/1999 | Yao | |
| 5,929,430 A | 7/1999 | Yao et al. | |
| 6,580,532 B1 * | 6/2003 | Yao et al. | 398/39 |
| 6,594,061 B2 * | 7/2003 | Huang et al. | 359/239 |
| 6,873,631 B2 | 3/2005 | Yao et al. | |
| 6,891,149 B1 * | 5/2005 | Lewis et al. | 250/227.14 |
| 7,027,675 B2 * | 4/2006 | Sayyah | 385/14 |
| 7,068,411 B2 * | 6/2006 | Dorrer et al. | 359/245 |
| 7,088,189 B2 | 8/2006 | Rohde et al. | |
| 7,151,415 B1 | 12/2006 | Zhou | |
| 7,173,749 B2 | 2/2007 | Maleki et al. | |
| 7,180,381 B2 | 2/2007 | Rohde et al. | |
| 7,460,746 B2 * | 12/2008 | Maleki et al. | 385/27 |
| 8,111,722 B1 | 2/2012 | Maleki et al. | |
| 8,121,475 B2 * | 2/2012 | Kagawa | 398/9 |
| 8,159,736 B2 | 4/2012 | Maleki et al. | |
| 2002/0181041 A1 * | 12/2002 | Tong | 359/123 |
| 2003/0090777 A1 * | 5/2003 | Yap | 359/333 |
| 2004/0101317 A1 | 5/2004 | Yap et al. | |
| 2004/0264977 A1 * | 12/2004 | Yap et al. | 398/161 |
| 2005/0127402 A1 * | 6/2005 | Dybsetter et al. | 257/200 |
| 2005/0185681 A1 | 8/2005 | Ilchenko et al. | |
| 2005/0281193 A1 * | 12/2005 | Hofmeister et al. | 370/217 |
| 2006/0239695 A1 * | 10/2006 | Sayyah | 398/161 |
| 2008/0080870 A1 * | 4/2008 | Tsuji | 398/155 |
| 2011/0292486 A1 | 12/2011 | Delfyett et al. | |
| 2012/0224865 A1 * | 9/2012 | Brown | 398/183 |
| 2012/0294319 A1 | 11/2012 | Maleki et al. | |
| 2013/0287065 A1 | 10/2013 | Sun et al. | |
| 2014/0186045 A1 * | 7/2014 | Poddar et al. | 398/115 |

FOREIGN PATENT DOCUMENTS

| | | |
|---|---|---|
| WO | 03088472 A2 | 10/2003 |
| WO | 2004077675 A2 | 9/2004 |
| WO | 2005017607 A2 | 2/2005 |

OTHER PUBLICATIONS

Yao et al., "Multiloop Optoelectronic Oscillator", IEEE Journal of Quantum Electronics, Vo. 36, No. 1, Jan. 2000, pp. 79-84.

Yao et al., "Optoelectronic Oscillator for Photonic Systems", IEEE Journal of Quantum Electronics, vol. 32, No. 7, Jul. 1996, pp. 1141-1149.

Yi, Ni, "Large Negative Dispersion in Square Solid-Core Photonic Bandgap Fibers", IEEE Journal of Quantum Electronics, vol. 41, No. 5, May 2005, pp. 666-670.

York et al., "Coupled-Oscillator Arrays for Millimeter-Wave Power-Combining and Mode-Locking", IEEE MTS-S Digest, 1992, pp. 429-432.

York et al., "Mode-Locked Oscillator Arrays", IEEE Microwave and Guided Wave Letters, vol. 1, No. 8, Aug. 1991, pp. 215-218.

Yu et al., "Ultralow-noise mode-locked laser with coupled optoelectronic oscillator configuration", Optics Letters, vol. 30, No. 10, May 15, 2005, pp. 1231-1233.

Bänky et al., "Calculations for the measure of the achievable phase noise reduction by the utilization of optimized multiloop opto-electronic oscillators", 2005.

Capmany et al., "High-Q microwave photonic filter with a tuned modulator", Optics letters, vol. 30, No. 17, Sep. 1, 2005, pp. 2299-2301.

Chang et al., "Phase Noise in Self-Injection-Locked Oscillators—Theory and Experiment", IEEE Transactions on Microwave Theory and Techniques, vol. 51, No. 9, Sep. 2003, pp. 1994-1999.

Daryoush et al., "Performance Evaluation of Opto-Electronic Oscillators Employing Photonic Crystal Fibers", Proceedings of the 36th European Microwave Conference, Sep. 2006, Manchester, UK, pp. 1111-1114.

Devgan et al., "Improvement in the Phase Noise of a 10 GHz Optoelectronic Oscillator Using All-Photonic Gain", Journal of Lightwave Technology, vol. 27, No. 15, Aug. 1, 2009, pp. 3189-3193.

Dijk et al., "Optimization of a 54.8 GHz Coupled Opto-Electronic Oscillator through Dispersion Compensation of a mode-locked semi-conductor laser", IEEE © 2008, pp. 279-282.

Dijk et al., "Phase Noise Reduction of a Quantum Dash Mode-Locked Laser in a Millimeter-Wave Coupled Opto-Electronic Oscillator", Journal of Lightwave Technology, vol. 26, No. 15, Aug. 1, 2008, pp. 2789-2794.

Docherty et al., "Theoretical Investigation of Optical Fiber-Length-Dependent Phase Noise in Opto-Electronic Oscillators", 2011.

Eliyahu et al., "Modulation Response (S21) of the Coupled Opto-Electronic Oscillator", IEEE © 2005, pp. 850-856.

Eliyahu et al., "Improving short and long term frequency stability of the opto-electronic oscialtor", 2002 IEEE International Frequency Control Symposium and PDA Exhibition, pp. 580-583.

Eliyahu et al., "Low Phase Noise and Spurious Level in Multi-Loop Opto-Electronic Oscillators", Proceedings of the 2003 IEEE International Frequency Control Symposium and PDA Echibition Jointly with the 17th European Frequency and Time Forum, pp. 405-410.

Eliyahu et al., "Phase Noise of a High Performance OEO and an Ultra Low Noise Floor-Cross-Correlation Microwave Photonic Homodyne System", IEEE © 2008, pp. 811-814.

Eliyahu et al., "RF Amplitude and Phase-Noise Reduction of an Optical Link and an Opto-Electronic Oscillator", IEEE Transactions on Microwave Theory and Techniques, vol. 56, No. 2, Feb. 2008, pp. 449-456.

Eliyahu et al., "Tunable, Ultra-Low Phase Noise YIG Based Opto-Electronic Oscillator", 2003 IEEE MTS-S Digest, pp. 2185-2187.

Fedderwitz et al., "Opto-Electronic Dual-Loop 50 GHz Oscillator with Wide Tunability and Low Phase Noise", IEEE © 2010, 3 pages.

Fuochi et al., "Study of Raman Amplification Properties in Triangular Photonic Crystal Fibers", Journal of Lightwave Technology, vol. 21, No. 10, Oct. 2003, pp. 2247-2254.

Hansen et al., "Solid-Core Photonic Bandgap Fiber with Large Anormalous Dispersion", Friday Morning, vol. 2/OFC 2003, pp. 700-701.

International Search Report and Written Opinion for Application No. PCT/US2013/076975 dated Apr. 25, 2014.

International Search Report and Written Opinion for Application No. PCT/US2014/017058 dated Jul. 25, 2014.

Kaba et al., "Improving Thermal Stability of Opto-Electronic Oscillators", IEEE Microwave Magazine, Aug. 2006, pp. 38-47.

Kotb et al., "Tuning of an RF Optoelectronic Oscillator", 2006.

Lee et al., "Detailed Theoretical and Experimental Study on Single Passband, Photonic Microwave FIR Filter Using Digital Micromirror Device and Continuous-Wave Supercontinuum", Jornal of Lightwave Technology, vol. 26, No. 15, Aug. 1, 2008, pp. 2619-2628.

Lee et al., "A 30-GHz Self-Injection-Locked Oscillator Having a Long Optical Delay Line for Phase-Noise Reduction", IEEE Photonics Technology Letters, vol. 9, No. 24, Dec. 15, 2007, pp. 1982-1984.

Lee et. al., "Low-Cost Optoelectronic Self-Injection-Locked Oscillators", IEEE Photonics Technology Letters, vol. 20, No. 13, Jul. 1, 2008, pp. 1151-1153.

Li et al., "Tunable Optoelectronic Oscillator Incorporating a High-Q Spectrum-Sliced Photonic Microwave Transversal Filter", IEEE Photonics Technology Letters, vol. 24, No. 14, Jul. 15, 2012, pp. 1251-1253.

Logan et al., "Forty-fifth annual symposium on frequency control", IEEE, © 1991, pp. 508-512.

Logan et al., "Ultra-Stable Microwave and Millimeter Wave Photonic Oscillators", 1992 IEEE Frequency Control Symposium, pp. 420-424.

Lynch et al., "A Mode Locked Array of Coupled Phase Locked Loops", IEEE Microwave and Guided Wave Letters, vol. 5, No. 7, Jul. 1995, pp. 213-215.

Lynch et al., "Stability of Mode Locked States of Coupled Oscillator Arrays", IEEE Transactions on Circuits and Systems-1: Fundamental Theory and Applications, vol. 42, No. 8, Aug. 1995, pp. 413-418.

Menyuk et al., An analytical model of the dual-injection-locked opto-electronic oscillator (DIL-OEO), IEEE, © 2009, pp. 870-874.

(56) References Cited

OTHER PUBLICATIONS

Nelson et al., "Microwave Optoelectronic Oscillator with Optical Gain", IEEE © 2007, pp. 1014-1019.

Okusaga et al., "Investigating the forward and backward injections of injection-locked dual optoelectronic oscillators", OSA/OFC/NFOEC 2009.

Ozdur et al., "Low Noise Optically Tunable Opto-Electronic Oscillator with Fabry-Perot Etalon", Journal of Lightwave Technology, vol. 28, No. 21, Nov. 1, 2010, pp. 3100-3106.

Pillet et al., "Dual-frequency laser at 1.5 mm for optical distribution and generation of high-purity microwave signals", Journal of Lightwave Technology, vol. 26, No. 15, Aug. 1, 2008, pp. 2764-2773.

Pillet et al., "Self-stabilization of the beatnote of a 1.5 mm dual-frequency laser", IEEE, © 2008, pp. 291-294.

Plessas et al., "A 5-GHz Injection-Locked Phase-Locked Loop", Microwave and Optical Technology Letters, vol. 46, No. 1, Jul. 5, 2005, pp. 80-84.

Ronald T Logan et al: "Forty-Fifth Annual Symposium on Frequency Control Stabilization of Oscillator Phase Using a Fiber-Optic Delay-Line", Forty Fifth Annual Symposium on Frequency Control, May 29, 1991, XP055129532.

Saitoh et al., "Hollow-Core Photonic Bandgap Fibers with Broadband Negative Dispersion Slope", OSA/CLEO/IQEC 2009, 2 pages.

Salik et al., "An Ultralow Phase Noise Coupled Optoelectronic Oscillator", IEEE Photonics Technology Letters, vol. 19, No. 6, Mar. 15, 2007, pp. 444-446.

Savchenkov et al., "Tunable optical single-sideband modulator with complete sideband suppression", Optics Letters, vol. 34, No. 9, May 1, 2009, pp. 1300-1302.

Savchenkov et al., "Whispering-Gallery Mode Based Opto-Electronic Oscillators", IEEE © 2010, pp. 554-557.

Sturzebecker, Dana L., "Optically controlled oscillators for millimeter-wave phased-array antennas", IEEE Transactions on Microwave Theory and Techniques, vol. 41, No. 6/7, Jun./Jul. 1993, pp. 908-1004.

Volyanskiy et al., "Compact optoelectronic microwave oscillators using ultra-high Q whispering gallery mode disk-resonators and phase modulation", Optics Express, vol. 18, No. 21, Oct. 11, 2010.

Volyanskiy et al., "Contribution of Laser Frequency and Power Fluctuations to the Microwave Phase Noise of Optoelectronic Oscillators", Journal of Lightwave Technology, vol. 28, No. 18, Sep. 15, 2010, pp. 2730-2735.

Várallyay et al., "Photonic Crystal Fibre for Dispersion Controll", Frontiers in Guided Wave Optics and Optoelectronics, Bishnu Pal (Ed.), ISBN:978-953-7619-82-4, In Tech, Feb. 2010, Available from: <http://www.intechopen.com/books/frontiers-in-guided-wave-optics-and optoelectronics/photonic-crystal-fibre-for-dispersion-controll>.

Williams et al., "Noise Characterization of an Injection-Locked COEO With Long-Term Stabilization", Journal of Lightwave Technology, vol. 29, No. 19, Oct. 1, 2011, pp. 2906-2912.

Yao et al., "Dual microwave and optical oscillator", Optics Letters, Vo. 22, No. 24, Dec. 15, 1997, pp. 1867-1869.

Yao et al., "A Light-Induced Microwave Oscillator" TDA Progress Report 42-123, Nov. 15, 1995, pp. 47-68.

Yao et al., "Converting light into spectrally pure microwave oscillation", Optics Letters, vol. 21, No. 7, Apr. 1, 1996, pp. 483-485.

Yao et al., "Coupled OptoelectronicOscillators for Generating Both RF Signal and Optical Pulses", Journal of Lighwave TEchnology, vol. 18, No. 1, Jan. 2000, pp. 73-78.

* cited by examiner

INTEGRATED PRODUCTION OF SELF INJECTION LOCKED SELF PHASE LOOP LOCKED OPTOELECTRONIC OSCILLATOR

FIELD OF THE INVENTION

This disclosure is directed to physical realization and cost efficient implementation of a system and method for controlling an optoelectronic oscillator ("OEO"). In a preferred embodiment, the OEO is capable of producing repetitive electronic sine wave and/or electrically modulated continuous wave or modulated optical signals.

BACKGROUND OF THE INVENTION

Generally, optoelectronic oscillators (OEO) receive pump continuous energy from an optical source, such as a laser, in addition to energy in the form of direct current (DC) power from a power supply. The energy is converted into radio frequency (RF) and microwave signals based on efficient power conversion by meeting the required gain and phase characteristics at an oscillation frequency using a narrowband filtering mechanism. The OEOs typically experience a low loss optical delay, low temperature sensitivity, and can be realized in modular structures. These benefits often lead to a high quality factor and greater stability for the optoelectronic oscillators in both the short term and the long term, as compared to electronic oscillators.

For example, a self-injection locked phase lock loop (IL-PLL) OEO is reported in U.S. patent application Ser. No. 13/760,767, the disclosure of which is hereby incorporated by reference herein in its entirety. In the OEO of that disclosure, a pure sinusoidal oscillating signal is sustained by actively filtering the sustaining signal from the surrounding interfering sources that contribute to close-in to carrier phase noise. Phase noise reduction is accomplished in several ways, including multiple lengths of optical delay lines and custom optical receivers to provide multiple electrical references for self-injection locking (IL), self-phase locked looping (PLL), and/or self-mode locking (ML) functions in a closed loop part. These components all contribute to a low noise stable RF oscillator configuration that supports self-sustained oscillations, provided that the electrical feedback signal fed to the modulator meets certain oscillation conditions in terms of its amplitude and phase. Meanwhile, corrections to any phase errors are provided using feedback systems to the tunable RF oscillator in self IL & PLL and optical laser source and modulator in self ML. In U.S. patent application Ser. No. 13/760,767, the frequency of the OEO output is controlled by several factors, such as the fiber delay length, the operating condition of an optical Mach-Zehnder modulator, and the band pass characteristics of an optical transversal RF filter used for narrowband filtering of the oscillating signal.

Such OEOs are conventionally assembled from discrete devices, require a large volume, have high power consumption, and require a great deal of real estate and cost. Additionally, due to the assembly of a large number of discrete parts, such OEOs are generally subject to vibration and G-sensitivity problems. These problems limit the utility of and possible applications for OEOs in several environments, such as both commercial and military environments.

Moreover, phase noise reduction using self-ILPLL does not achieve a sufficiently commercially viable product unless major low noise and efficient design innovations are considered to accommodate a low cost manufacturing process to meet the continuously increasing demand for quality services at a lower cost. As a result, there is a need for an optoelectronic oscillator having design topologies that meet the design constraints for implementation of a stable ultra-low phase noise frequency synthesizers in a small size and low cost.

SUMMARY OF THE INVENTION

The key to developing of integrated photonic components using Silicon CMOS, BiCMOS technology, eliminating the need for bulky and/or discrete microwave components.

One aspect of the disclosure provides for a monolithically integrated optoelectronic oscillation circuit for sustaining an oscillating optical signal. The oscillation circuit may include an injection locking circuit having at least one fiber optic delay line configured to receive a first portion of the optical signal. The oscillation circuit may also include a phase lock loop circuit having at least two fiber optic delay lines configured to receive other portions of the optical signal. The oscillation circuit may further include a monolithically integrated voltage controlled oscillator configured to generate a stable oscillating signal in response to each of an injection locking signal derived from the first portion of the optical signal and a phase lock loop signal derived from the other portions of the optical signal. The stable oscillating signal may be configured to RF modulate the optical signal. In some aspects, at least one of the fiber optic delay lines may be integrated in a mandrel having a diameter of about 1 inch or less. The mandrel is covered by a resin emulsion. The fiber optic delay line of the injection locking circuit may have a length that is shorter than either of the fiber optic delay lines of the phase lock loop circuit to significantly improve both far away from carrier and close-in phase noise respectively.

In some aspects of the disclosure, the oscillation circuit may further include at least one phase detector coupled to the phase lock loop circuit and configured to determine a difference in phase between the respective signals propagating over each of the at least two fiber optic delay lines.

The voltage controlled oscillator included in the oscillation circuit may include a resonator coupled to the injection locking circuit. The resonator may be configured to receive a processed signal derived from the first portion of the optical signal. The resonator may also be coupled to a pair of dynamically tuned resonators. Each of the dynamically tuned resonators may be coupled to a respective fiber optic delay line of the phase lock loop circuit and configured to receive processed signals derived from the other portions of the optical signal. In some aspects, the resonator may be capacitively coupled to each of the pair of dynamically tuned resonators. The resonator may be a microstrip line resonator, and may be a metamaterial evanescent mode combiner network. The phase of the resonator may be dynamically tuned by a phase tuning circuit that is coupled to each of the resonator and the dynamically tuned resonators.

Another aspect of the disclosure provides for an optoelectronic oscillator including a modulator providing an optical signal, and first, second and third photodetectors for receiving portions of the optical signal. Each of the first, second and third photodetectors have an output that is coupled to a first, second, and third amplifier respectively. The oscillator may also include a phase detector for receiving a first RF signal from the first photodetector and a second RF signal from the second amplifier with a longer delay than the first RF signal. The phase detector may be configured to determine a phase difference between the first and second RF signals. The oscillator may further include a voltage controlled oscillator for receiving a third RF signal from the third photodetector, and for receiving an electrical signal from the phase detector. The voltage controlled oscillator may be configured to output an oscillating signal in response to each of the electrical signal and third RF signal. The oscillating signal may be used to control an output of the modulator. Each of the modulator, optical filter, photodetectors, amplifiers, phase detector, voltage controlled oscillator may be formed on an integrated circuit using, for example, Si-photonics integrated with Bi-CMOS technology.

In some aspects of the disclosure, the modulator may be an optical Mach-Zhender modulator having an electro-optic polymer. The optical Mach-Zehnder modulator may further include a mixture of chromophores and an electro-optic polymer. Modulator implementation may be integrated with photonic bandgap structures as a slow wave structure to enhance the effective electro-optic characteristics of the polymer. The modulator may exhibit an electro-optic coefficient of about 100 pm/V or greater at a wavelength of 1550 nm, or about 1150 pm/V at a wavelength of 1060 nm, an optical loss of about 1.5 dB/cm or less, and a half-wave voltage of about 0.5V or less. The modulator may be configured to be laterally poled or transversely poled using an electric field between about 10V/μm and about 200V/μm, in some aspects at a temperature of about 110 C. In some aspects, the modulator may be a microstrip line in a substrate having a thickness of about 2 mm or more. The modulator may operate at up to about 60 GHz in a single mode quasi-TEM mode, depending on the width of the substrate.

In further aspects of the disclosure, the third optical filter may include a Fabry-Perot laser diode that is capable of suppressing sidemodes of the portion of the optical signal received by the third optical filter at a ratio of at least 75 dB. In further aspects, the oscillator may further include a tunable phase-shifted fiber Bragg grating and a phase modulator. Each of those components may be integrated in the integrated circuit. In some aspects, the modulator may include a frequency shifter capable of tuning the oscillating frequency of the oscillator by changing an optical pump wavelength.

The oscillator may include a whispering gallery-mode resonator in place of the electrical filtering components.

The oscillator may achieve significantly reduced power consumption compared to that of an oscillator formed from discrete components. In some aspects, the RF components of the oscillator may consume about 200 mW of power or less. The modulator of the oscillator may be driven by a driver using about 500 mW of power or less. The oscillator may operate from a power supply having a voltage of about 2 volts or less.

Yet another aspect of the present disclosure is the possibility of monolithically integrating the optical source using either a distributed feedback laser or a long Fabry-Perot InGaAsP/InP laser diode, an electro-absorption modulator (EAM), optical photodetectors of InGaAs/InP, and electronic circuits for amplification of the photodetected signals and generation of an oscillating signal in the voltage controlled oscillator (VCO). The electronic circuits may be realized with either homojunction or heterojunction field effect transistors (e.g., MOSFET, MESFET, MISFET, HEMT). In another modification of this monolithically integrated circuit both a long cavity laser diode and an EAM may be integrated with a semiconductor optical amplifier (SOA), a phase modulator for active mode-locking, and a photodetector for active monitoring. Either an intermodal oscillation frequency related to a natural driving oscillator or an evanescently coupled VCO may be used for driving the EAM.

DETAILED DESCRIPTION

Figure 1A:
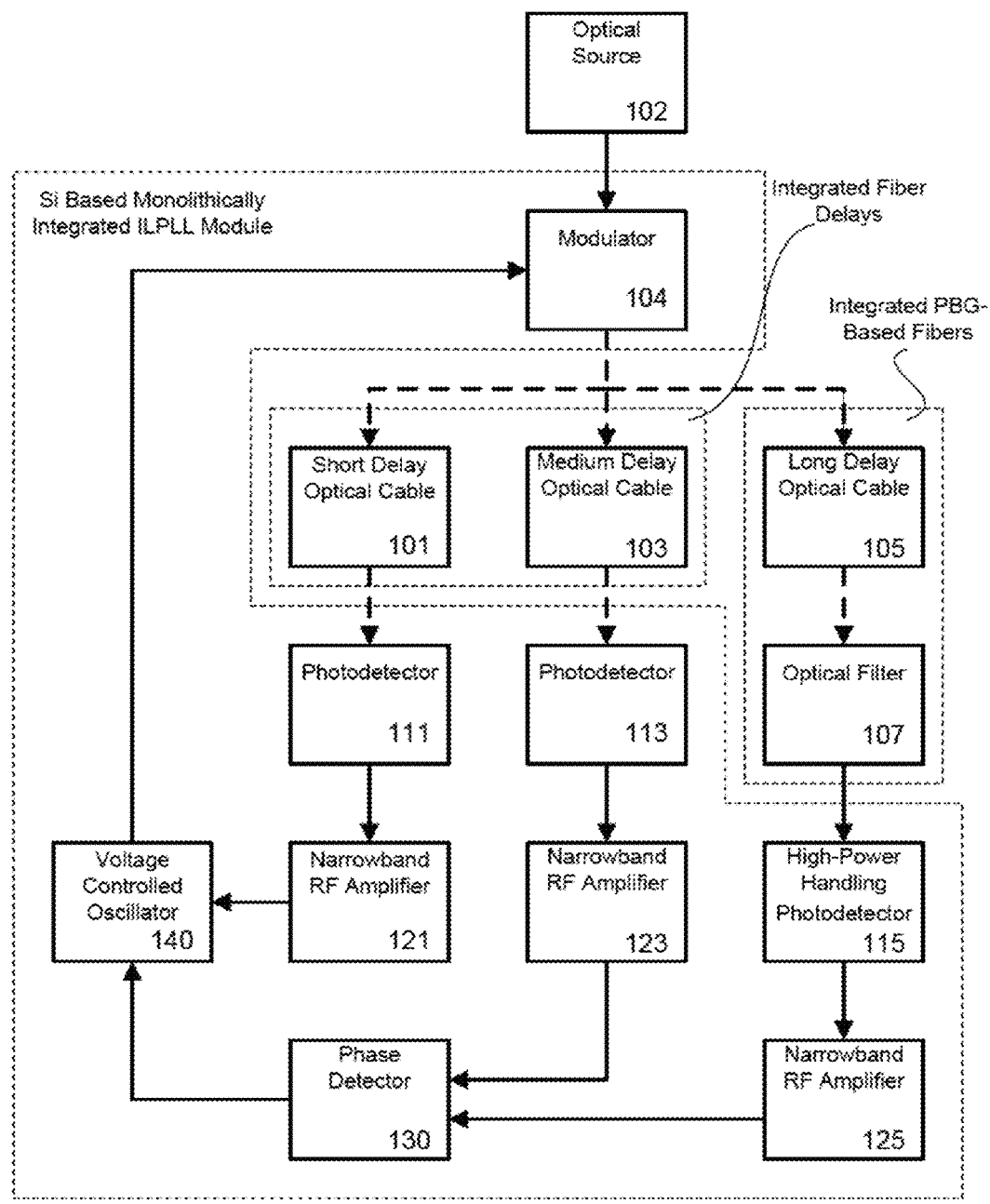
FIGS. 1a and 1b are functional block diagrams of an oscillator in accordance with some aspects of the disclosure.

The present invention details fabrication guidelines of integrated optoelectronic oscillators with frequency and phase stability that are required for both a narrower channel resolution (due to, e.g., reduction of phase noise) as well as a more precisely locked frequency (due to, e.g., reduced temperature sensitivity) than that achieved by conventional OEO systems. As a result, data may be transmitted over a given communication bandwidth at a lower bit error rate. Moreover, the RF and optical signal, given their low phase noise characteristics, could be used as a stable clock for electrical and optical sampling of broadband information in analog to digital converters and a number of other digital processing functions.

Yet another object of the disclosure is to provide an integrated optoelectronic filtering system having higher frequency selectivity in a relatively small size (compared to the larger size of a higher order electrically realized RF filter), reduced temperature sensitivity, and minimized frequency drift.

A yet further object of the disclosure is to implement an oscillation system that allows for converting light energy at a given wavelength into stable, spectrally pure RF/microwave reference signals having reduced close-to-carrier (at an offset frequency of 1 MHz or less) phase noise. Yet another object of the disclosure is to provide low cost fabrication guidelines of a tunable oscillation system in which it is possible to synthesize any precise RF frequency by adjusting the optical source wavelength leading to satisfying oscillation conditions for a new RF frequency in highly dispersive photonic bandgap fibers. A desirable frequency synthesis is achieved by control of laser wavelength by tuning the external cavity.

These and other objects of the disclosure are beneficial for obtaining an optoelectronic oscillator with a cleaner signal than the signals outputted by oscillators currently known in the art. For example, RF oscillators currently known in the art may achieve a noise reduction of, at best, about −110 to about −120 dBC/Hz at a 10 kHz offset. In contrast, the microfabricated OEO of the present disclosure, using Si-photonics combined with Si based low-noise CMOS circuits, can result in optoelectronic oscillators with phase noise approaching −150 dBC/Hz at 10 kHz offset.

By achieving a cleaner signal, the OEO of the present disclosure are capable of maintaining frequency channels close to one another and exhibiting noise reduction, phase control, phase error reduction, and bit-error rate reduction sufficient enough to keep closely packed frequency channels apart in a cost effective and size efficient manner. Keeping frequency channels apart is especially important cellular technologies that rely on high-order frequency division, such as Orthogonal frequency-division multiplexing (OFDM) or high-order phase-shift keying (PSK). The optoelectronic oscillators of the present disclosure may also be utilized in base stations, radar systems, high resolution remote sensing systems, timekeeping systems, or frequency synthesizers.

The accompanying Figures illustrate at least some embodiments of an OEO having the above described benefits, which are further defined in detail in the following description. Those having ordinary skill in the art may be able to make alterations and modifications to what is described herein without departing from its spirit and scope. Therefore, what is illustrated is set forth only for the purposes of example and should not be taken as a limitation in the scope of the present disclosure.

Referring now to the figures, FIG. 1a illustratively depicts a functional block diagram of an optoelectronic oscillator 100 in accordance with an aspect of the present invention. The oscillator 100 includes a high power tunable optical source 102, such as a laser with an external cavity, and an optical modulator 104. The optical source 102 provides a high power light source for operation of the oscillator 100. The intensity of the light source may be modulated by the modulator 104 to produce a time-varied optical signal, such as a sinusoidal optical waveform. The modulator 104 may be a Mach-Zehnder modulator capable of splitting and recombining the incoming signal, yielding a 180 degree phase shift of the signal between two split arms of interferometer to achieve cancellation of the signal. The modulator 104 may be biased at various operation points ranging from a quadrature point to a pinch-off point. The operation point established may be employed for linear operation and nonlinear $2^{nd}$ harmonic generation.

The outputted optical signal of the modulator 104 may be split into multiple output signals. In some examples, the signal may be split by an optical directional coupler (not shown). The directional coupler may split the signal evenly among distinct optical fiber cables 101, 103, and 105. In the example of FIG. 1a, the cables are coupled in series. In other examples, the cables may be coupled in parallel.

In addition to splitting the optical signal among optical fiber cables shown in FIG. 1a, the optical signal may also be split to provide an optical output (not shown) for use external to the oscillator 100. Aside from the optical output signal, the oscillator 100 may also be capable of outputting a sustained oscillating electrical output signal. The sustained electrical output may be outputted at any point of the optoelectronic oscillator's electrical wiring, which is illustrated in FIG. 1a by a solid line. Similarly, the optical output may be outputted at any point of the optoelectronic oscillator's optical connection (except for the connection between the optical source 102 and the modulator 104), which is illustrated in FIG. 1a by a dashed line.

The optical signals outputted by the modulator 104 may be processed in a manner similar to the process described in U.S. patent application Ser. No. 13/760,767. The processing may include propagation through an optical fiber delay line, optical filtering, and conversion of the optical signals to electrical signals. The processing may also include further filtering, amplification, phase comparison, and locking of the electrical signals. The processed signals may then be fed back into the modulator 104 as an electrical input. The electrical input may provide feedback for properly maintaining the stability of the signal produced by the RF oscillator 100 (e.g., prevent phase shift of the signal, prevent frequency shift of the signal, etc.).

In the example of FIG. 1a, the optical signal propagating along short delay optical cable 101 is converted into an electrical signal using a photodetector 111 and amplified using a narrow band RF amplifier 121. This signal is then used as an injection locking signal to control a voltage controlled oscillator (VCO) 140, where far away from carrier phase noise may be reduced in short time periods using a short fiber delay line. Similarly, optical signals propagating along medium delay optical cable 103 and long delay optical cable 105 are converted into electrical signals using photodetectors 113 and 115, respectively, and amplified using narrow band RF amplifiers 123 and 125, respectively. The signals are then compared using a phase detector 130, and the output of the phase detector 130 is used to control the VCO 140, where close-in to carrier phase noise below 1 MHz requires delays that are at least 5 μs. Unlike the configuration of the ILPLL OEO of U.S. patent application Ser. No. 13/760,767, the present integration approach uses a short delay for self IL and a relatively longer delay for self PLL.

The long delay optical cable 105 may further include a Raman amplifier to reduce signal attenuation along the length of the long delay (thereby permitting for a longer delay line that otherwise possible without the Raman amplifier). Raman amplification can be implemented in Si-Photonics utilizing the optical nonlinearity of Si optical waveguides.

Further, the long delay line 105 may be coupled to an optical filter 107, such as a tunable nested loop optical filter using photonic bandgap (PBG) fibers. The tunable filter may include a polarization-sensitive Hi-Bi fiber, or a multiple-arm cascaded filter having two or more optical couplers using bi-conical designs for series power division/combining, or optical waveguides for parallel power division/combining.

In some examples, the fiber optic delay lines may have a large dispersion coefficient to achieve active tuning of the RF oscillator when the optical source wavelength undergoes a shift. In some examples, the dispersion parameters may be up to about 1000 ps/nmkm with an achieved tuning of about 20 MHz/km for a 10 nm tuning at about 1550 nm. Thus, as the optical source wavelength undergoes a shift, the bandpass frequency of the tunable filter is subject to change and the oscillation condition of the oscillator may be satisfied at a new frequency. The optical tunable nested loop filter is to control the new accepted modes in the RF spectrum. The frequency shift Δf follows the following relationship:

$$\frac{\Delta f}{f} = \frac{\tau_D}{\tau}$$

where f is the initial oscillation frequency, τ is the fiber delay time before tuning, and $\tau_D$ is the delay time after wavelength tuning in the dispersive fibers. The newly selected oscillation frequency is capable of maintaining similarly low phase noise and could be programmed to meet a frequency synthesizer requirement.

Figure 1B:
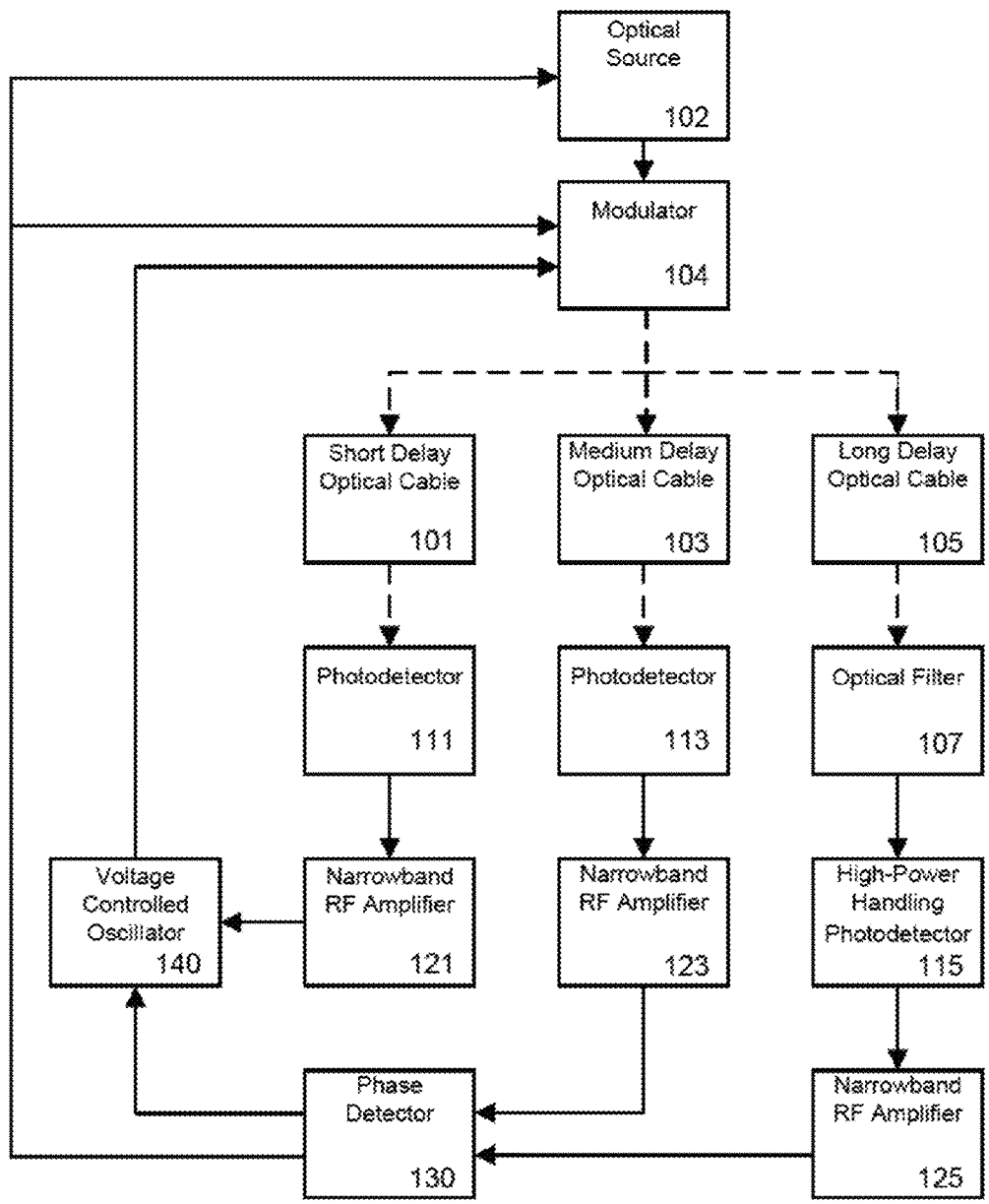

FIG. 1b depicts a functional block diagram of the optoelectronic oscillator 100 of FIG. 1a in a mode locking configuration. In addition to the connections described in accordance with FIG. 1a, in the mode locking configuration of FIG. 1b the phase detector 130 is electrically coupled to the optical source 102 and/or the modulator 104 and hence significantly reduces the close-in to carrier phase noise using mode-locking of large number of supported modes. The mode locking technique achieved by coupling the phase detector 130 to either or both the optical source 102 and the modulator 104 may include any of mode suppression, mode injection, mode coupling, mode combining, multi-mode injection coupling, or evanescent mode coupling. Mode locking may be beneficial for locking each of the optical modes of the optical source 102 and/or modulator 104 output to a fixed phase and hence significantly reducing the close-in to carrier phase noise. In some examples, the mode locking technique uses a delay element (e.g., an optical fiber or electronic cable) to store energy for a sufficient duration using evanescent mode coupling and dynamic mode spacing of the optical delay line to achieve a zero or minimum frequency drift. Since the optical fiber may be intrinsically temperature sensitive, causing change in effective length and refractive index over temperature, the oscillator needs a control circuit to regulate the effective fiber length to prevent mode-jumping phenomena and thereby degradation from close-in to carrier phase noise. The active degenerative feedback, in conjunction with the self-injection and mode-locking techniques, produces uniformly fixed mode spacing, thereby reducing frequency drift due to operating temperature changes.

The oscillator 100 may be fabricated as an integrated device using integrated Si-photonics with Bi-CMOS. For instance, the fiber optic cables 101, 103, and 105 may be integrated in small form factor mandrels each with a diameter of about 1 inch or less. In some examples, the mandrels could be covered by resin emulsions for mechanical stability. The optical detectors 111, 113, and 115 may be monolithically integrated silicon and/or hetro-jucntion $Si_{1-x}$—$Ge_x$ photodiodes. Specifically, photodetector 115 may be a high-power handling photodiode. The amplifiers 121, 123, and 125 may include SiGe HBT devices for degenerative feedback amplification.

Like the Si based components described above, the VCO 140 may also be any Si CMOS based voltage controlled oscillator known in the art (e.g., a Clapp oscillator, Colpitts oscillator, etc.) In one example, the VCO 140 may include a varactor, such as an MOS varactor, Schottky diode, or a reverse biased PN junction diode varactor, or other semiconductor device which functions as a voltage-controlled capacitor. The effective capacitance of the varactor may vary with changes in the voltage of the processed signal received from RF amplifiers 123 and 125. By adjusting or tuning the effective capacitance of the varactor in the VCO 140, the frequency at which the VCO 140 resonates may in turn be adjusted.

Figure 2:
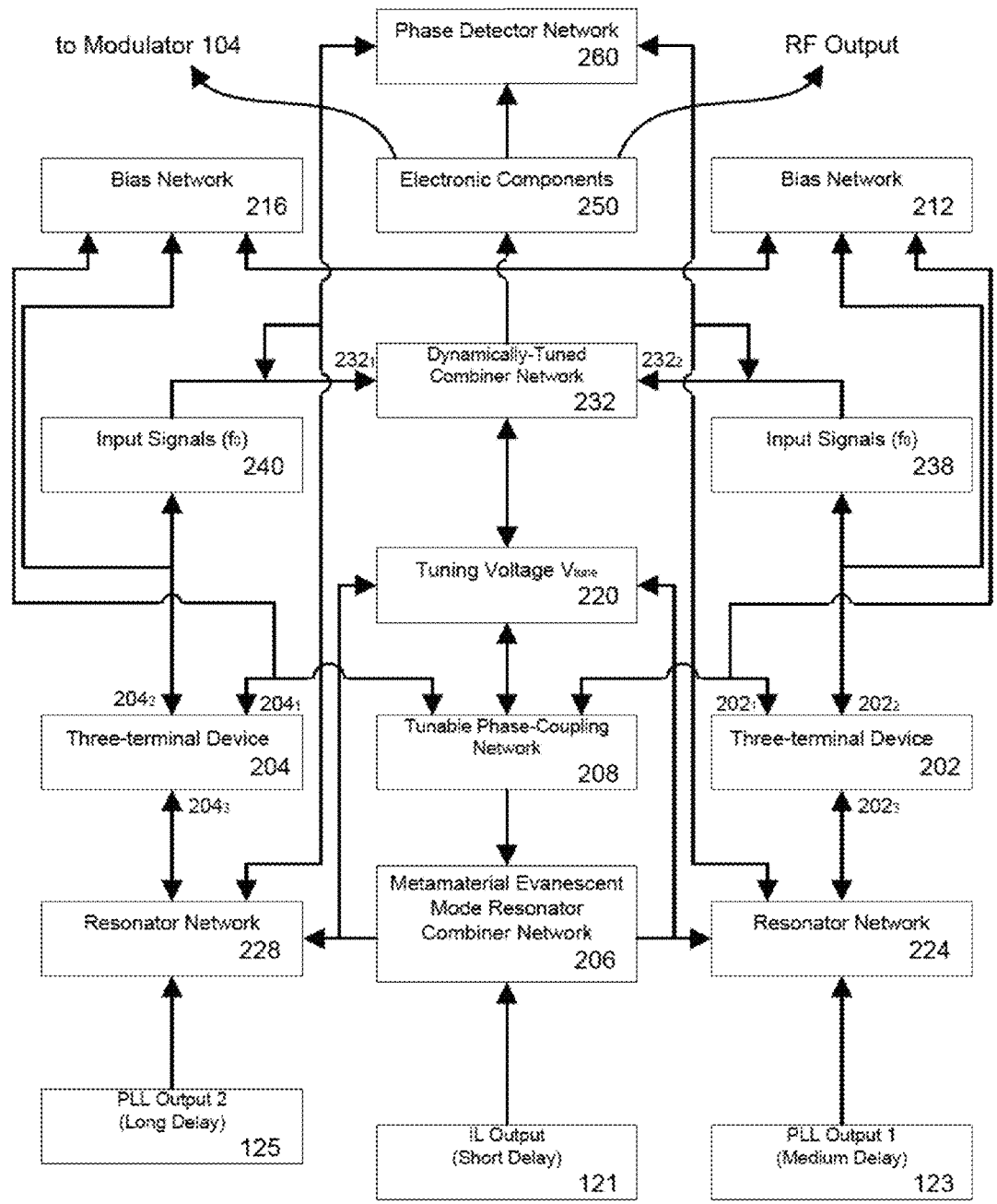
FIG. 2 is a functional diagram of a tunable RF oscillator in accordance with an aspect of the disclosure.

FIG. 2 is an example functional diagram of the phase detector 130 and VCO 140 of FIG. 1. The oscillating circuit diagrammed in FIG. 2 operates similarly to the VCO/oscillator previously disclosed in U.S. Pat. No. 7,088,189, the disclosure of which is hereby incorporated by reference herein in its entirety. One significant difference between the oscillator of that disclosure and that of the present disclosure is that the previously disclosed oscillator is capable of PLL only whereas the oscillator of the present disclosure is capable of self-ILPLL and therefore achieves a significantly greater close-in to carrier phase noise reduction.

As FIG. 2 shows, the VCO/oscillator 200 includes a pair of three terminal devices, 202 and 204, which are coupled together through the other modules shown. More particularly, each device 202 and 204 includes three terminals, illustrated as $202_1$, $202_2$ and $202_3$ and $204_1$, $204_2$ and $204_3$, respectively. The first terminal $202_1$ of first device 202 is coupled to a tunable phase coupling network 208 and bias network 212. The tunable phase coupling network 208 is also coupled to the first terminal $204_1$ of the second device 204, which is also coupled to a bias network 216 at terminal $204_1$. The tunable phase coupling network 208 is also coupled to tuning voltage block 220. The tuning voltage block 220 is coupled to dynamically tuned coupled-resonator networks, 224, 228, which are respectively coupled to the third terminals $202_3$, $204_3$ of each of the three terminal devices.

The three-terminal devices preferably comprise a bipolar transistor, wherein the first, second and third terminals of the three terminal device comprise the collector, base and emitter nodes of the bipolar transistor. On the other hand, the three terminal device may comprise a field effect transistor, wherein the first, second and third terminals of the three terminal device comprise the collector, base and emitter nodes of the field effect transistor. As a general matter, the three terminal device desirably includes any three terminal device that is operable to provide a 180 degree phase shift any two terminals.

The tuning voltage block 220 is further coupled to a dynamically-tuned combiner network 232, which includes two input ports, $232_1$ and $232_2$. Each of the input ports $232_1$ and $232_2$ accept input signals 238, 240 present at the second terminals $202_2$ and $204_2$ of each of the devices. The dynamically-tuned combiner network 232 combines the input signals 238, 240 and produces an RF signal operating at the second harmonic of the input signals 238, 240. The RF signal may coupled to a modulator 104 or other device through electronic components 250 including a buffer, low noise amplifier, and bandpass filter.

The oscillator 200 further includes a phase detecting network or phase detector 260 coupled between resonator networks 224, 228 and combiner network 232, as shown. The phase detector network 260 may be realized by using a divider, amplifier and balanced mixers arranged in a conventional manner. The divider may comprise MC10EL32, made by ON Semiconductor, Inc., and the amplifier and balanced mixes may, respectively, comprise OPAMP TL071 from Texas Instruments and mixers available from Synergy Microwave, the assignee of the present invention. The phase detector network 260 dynamically compensates for phase errors between each oscillator during wideband operation. The phase detector network 260 detects random fluctuations in the free-running frequency and translates those fluctuations into phase errors. The phase errors are then fed back to the combiner network 232 and used to control the phase and frequency of the buffered signal 250 during tuning operation. The phase errors are also fed back to the dynamically tuned coupled resonator networks 224, 228 and used to tune the oscillating frequencies of the each of the three terminal devices.

Figure 3:
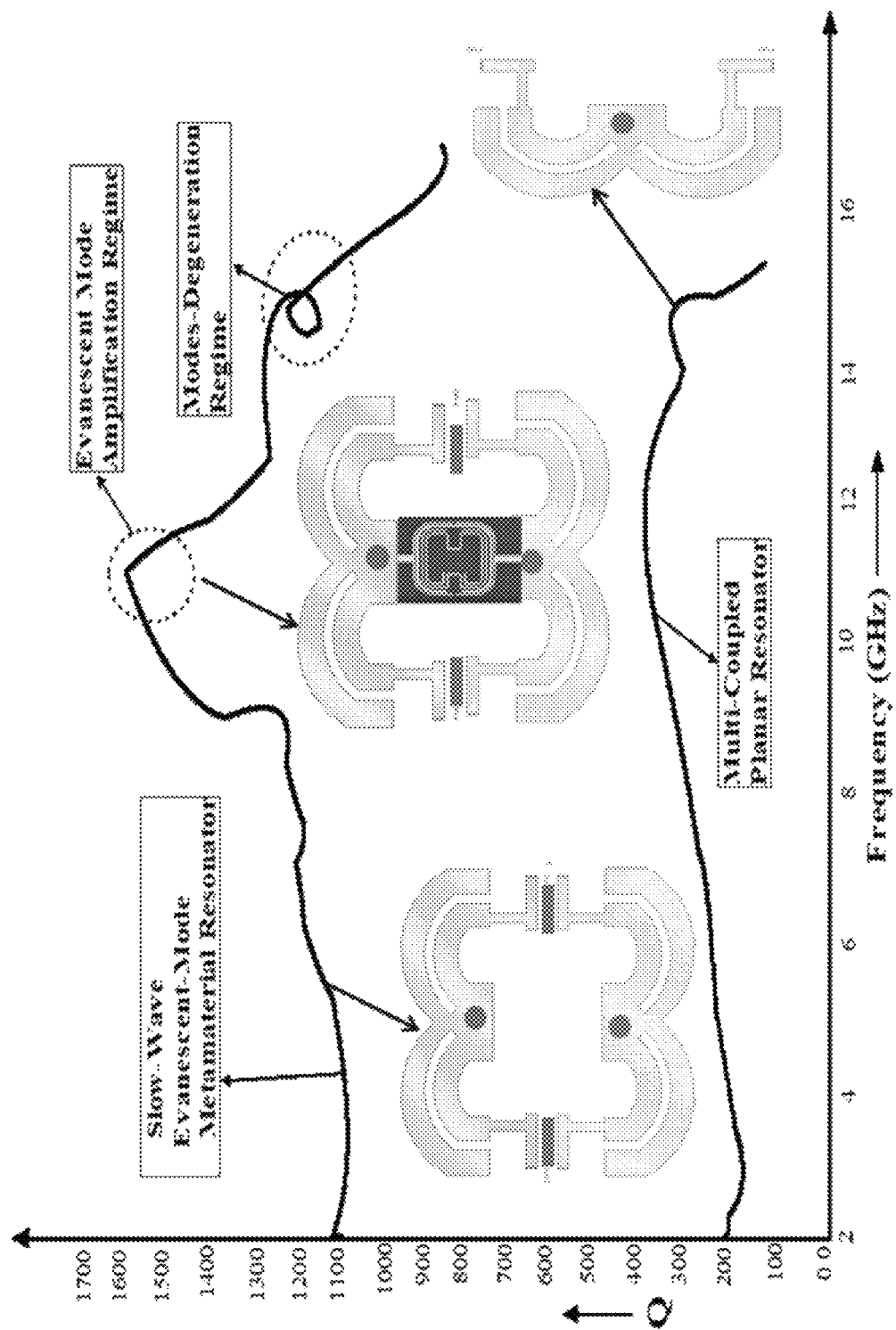
FIG. 3 is a graphical plotting of the quality factor (Q) of a multi-coupled resonator and a metamaterial evanescent mode resonator, in accordance with an aspect of the disclosure.

The oscillator 200 further includes an evanescent mode resonator-combiner network 206. In some examples, such as the example of FIG. 2, the evanescent mode resonator-combiner network 206 may be a metamaterial resonator using a microstrip line resonator. The unique properties of the metamaterial resonator is that it has a negative permittivity and negative permeability, and that it enables amplification of an evanescent mode wave without degeneration. Hence, including a metamaterial evanescent mode resonator can yield a loaded Q-multiplier effect (effectively multiplying the effect of the circuit's Q with regard to the phase noise of the circuit) in the oscillator 200 (or other autonomous circuits). Utilization of the evanescent mode resonator is beneficial, as compared to use of a multi-coupled planar resonator. FIG. 3 depicts the difference in Q (quality factor) between the evanescent mode resonator and multi-coupled planar resonator, plotted against a range of operating frequencies from about 2 GHz to about 15 GHz. As depicted in FIG. 3, the evanescent mode resonator is capable of achieving a quality factor above 1000 at operations frequencies ranging from about 2 GHz to about 15 GHz. FIG. 3 further depicts one of the benefits of utilizing metamaterial evanescent mode resonator, as it achieves an even greater Q in the evanescent mode amplification regime (between about 8 GHz and about 12 GHz). In this regime, a quality factor Q above 1500 may be achieved, and mode degeneration does not reduce Q until operation reaches about 15 GHz.

The metamaterial evanescent mode resonator-combiner network 206 is coupled (e.g., capacitively) to each of the dynamically tuned resonator networks 224 and 228. The metamaterial evanescent mode resonator-combiner network 206 acts as an evanescent mode (EM) buffer, storing a portion of the excess radio frequency (RF) energy coupled into the resonator network for a given period of a signal cycle so that the conduction angle of the device can be reduced, thereby reducing the average noise performance for a given period of time.

In FIG. 2, the metamaterial evanescent mode resonator-combiner network 206 is also coupled to the tuning voltage block 220. As such, the tuning circuit 220 can operate as a variable capacitor, thereby improving the loaded Q factor due to the evanescent phenomena of the resonator. The metamaterial evanescent mode resonator-combiner network 206 may be controlled using a feedback control (e.g., the various delayed OEO signals detected by the optical detectors of 111, 113, and 115 and boosted by the narrow band RF amplifiers 121, 123, and 125). The microwave carrier is generated by locking the optical phase modulation to a free spectral range resonator, which occurs in the 10 GHz region. Moreover, this carrier is detected by a standard photodiode. The tunable phase coupling network 208 is also coupled to the metamaterial evanescent mode resonator-combiner network 206 to dynamically tune the phase of the resonating wave.

The oscillator 200 preferably operates in the following manner. The electrical outputs of narrowband RF amplifiers 123 and 125 are respectively input to the dynamically tuned coupled resonator networks 224 and 228. Similarly, the electrical output of narrowband RF amplifier 121 is input to the metamaterial evanescent mode resonator-combiner network 206. These signals provide injection locking (IL) and phase locking loop properties under which the resonance of the VCO is controlled. The circuit elements comprising the various modules, e.g., diodes, resistors, capacitors, resonators, etc., are selected so that each of the three terminal devices 202, 204 oscillate at a fundamental frequency, $f_0$. As the voltage level of the tuning voltage module 220 is adjusted the fundamental frequency of operation, $f_0$, appearing as input signals 238, 240 is tuned over the operating range of the oscillator, e.g., preferably octave-band. These signals 238, 240 are then combined in the combiner network 232 to produce a signal operating at twice the fundamental frequency, $2f_0$, and that is dynamically tuned as the voltage level of the tuning voltage module 220 is adjusted. A portion of the signal from the combiner network 232 is fed to the modulator 104 through electronic circuitry including a buffer, low noise amplifier, and bandpass filter 250. A portion of the signal may also be output as a tunable output (e.g., a signal operating at the second harmonic of the input signals).

A select portion of a signal from the combiner network 232, as well as a select portion of a signal from the metamaterial evanescent mode resonator-combiner network 206, are also fed back to the tuning block 220. A portion of the signal 254 is then fed to tunable phase coupling network 208 and used to dynamically tune the phase of the output signals 238, 240, so that each of these signals remain in phase during a tuning operation. A portion of the signal 254 is also fed to each of the dynamically-tuned coupled resonator networks 224, 228, so that the frequency, $f_0$, present at block 238 is at the same frequency as the signal present at block 240. Accordingly, as the tuning voltage, $V_{tune}$, is adjusted the frequency of the signals, $f_0$, present at each of the terminals 202₂ and 204₂ are tuned over the operating frequency band through the coupled resonator networks 224, 228, while the phase coupling network 208 keeps the two devices 202, 204 operating in an anti-phase mode at the fundamental frequency, $f_0$ (e.g., push-pull behavior), while the second harmonic, $2f_0$, interferes constructively (e.g., push-push behavior) over the octave band. In addition, the phase detector network 260 operates as described above to dynamically compensate for phase errors during wideband operation.

Figure 4A:
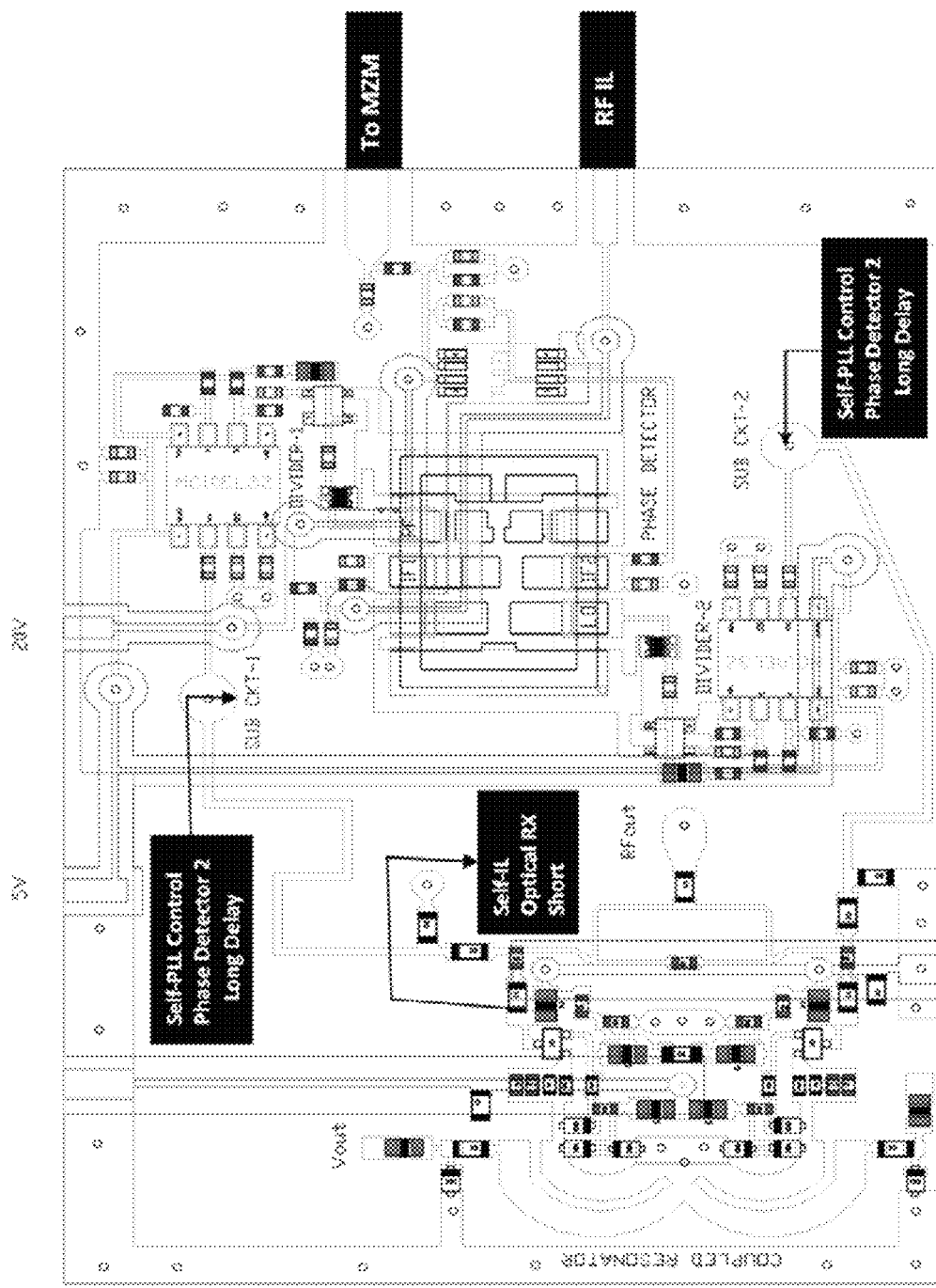
FIG. 4a is an example printed circuit board layout of the tunable RF oscillator of FIG. 2, in accordance with an aspect of the disclosure.
Figure 4B:
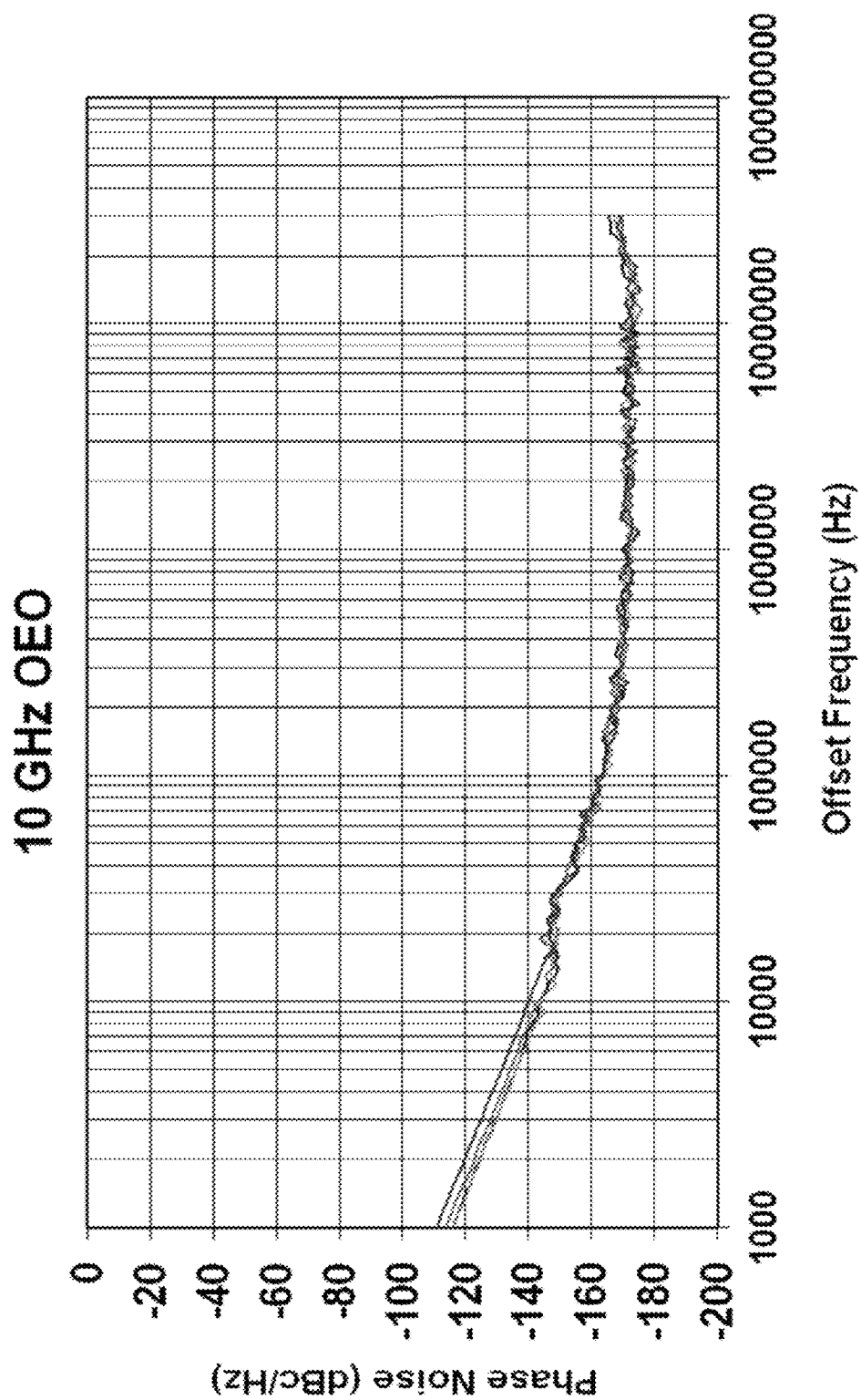
FIG. 4b is a data simulation of phase noise of the tunable RF oscillator of FIG. 2, in accordance with an aspect of the disclosure.

FIG. 4*a* is an example printed circuit board (PCB) diagram of a monolithic integration of the oscillator 100 of FIGS. 1*a*, 1*b*, and 2 using CMOS and/or microelectronic fabrication technology. As shown from the diagram of FIG. 4*a*, the design topology of the oscillator 100 is quite amenable to Si fabrication techniques and can be fabricated by one having ordinary skill in the art with a small form factor as depicted. FIG. 4*b* graphically depicts the phase noise of the above described oscillator, as plotted against the operation frequency along a range between about 1 kHz to 30 MHz for an oscillator operating at about 10 GHz.

Figure 5:
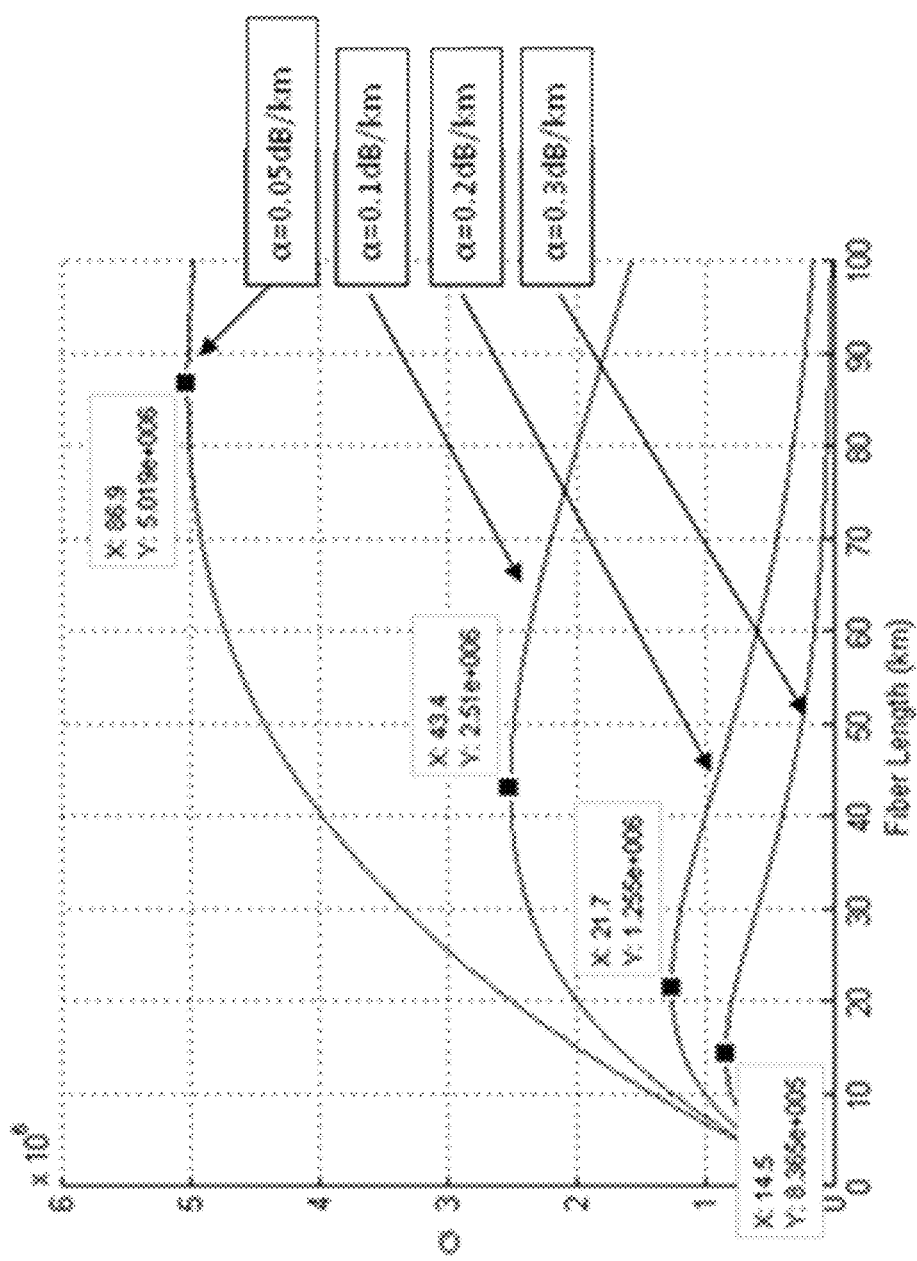
FIG. 5 is a graphical plotting of the quality factor (Q) of an optical fiber delay cable in accordance with an aspect of the disclosure.
Figure 6A:
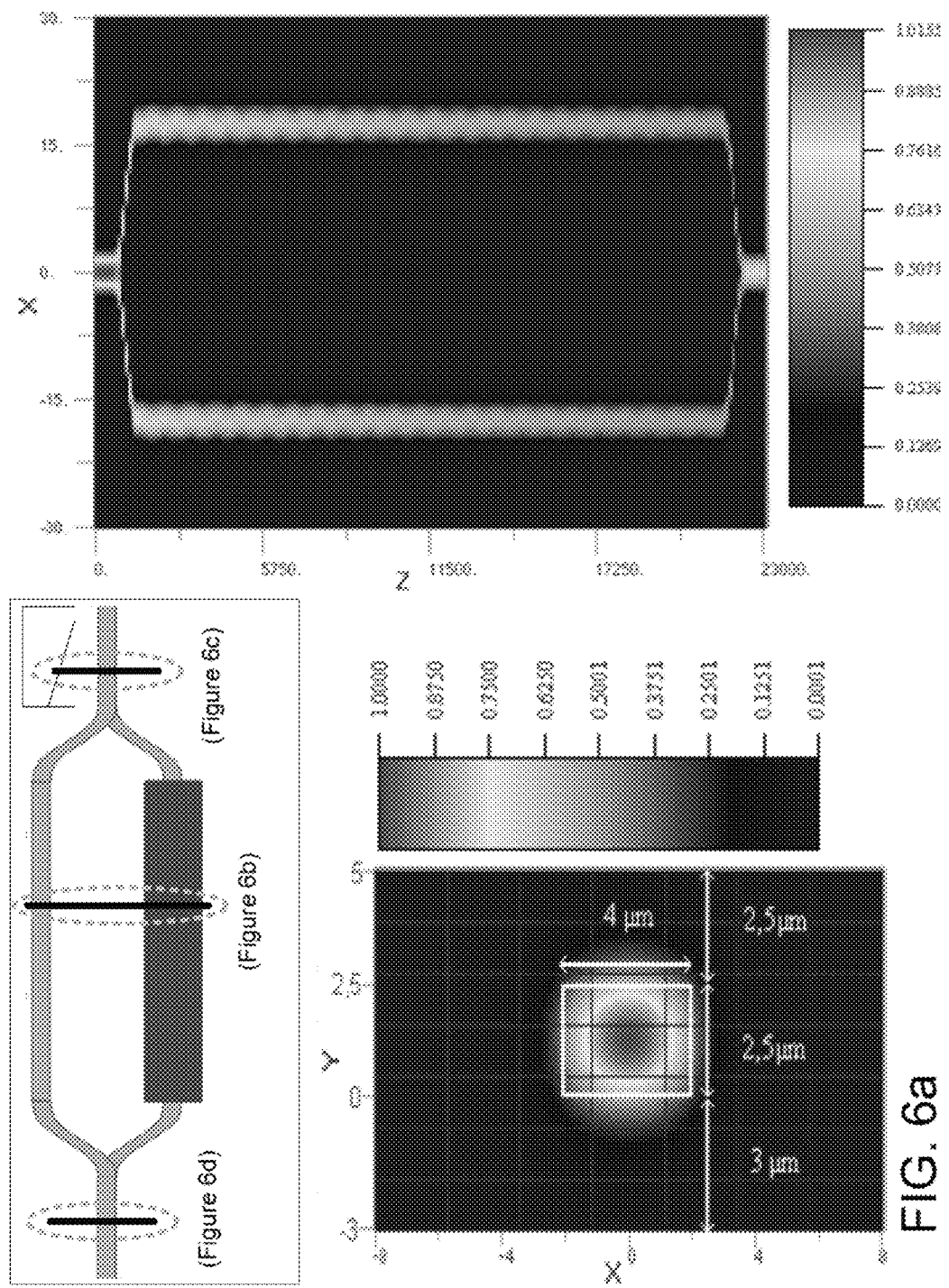
FIG. 6 is a graphical intensity plot of an Si-photonics based Mach-Zehnder modulator (MZM) in accordance with an aspect of the disclosure along length of MZM.
Figure 6B:
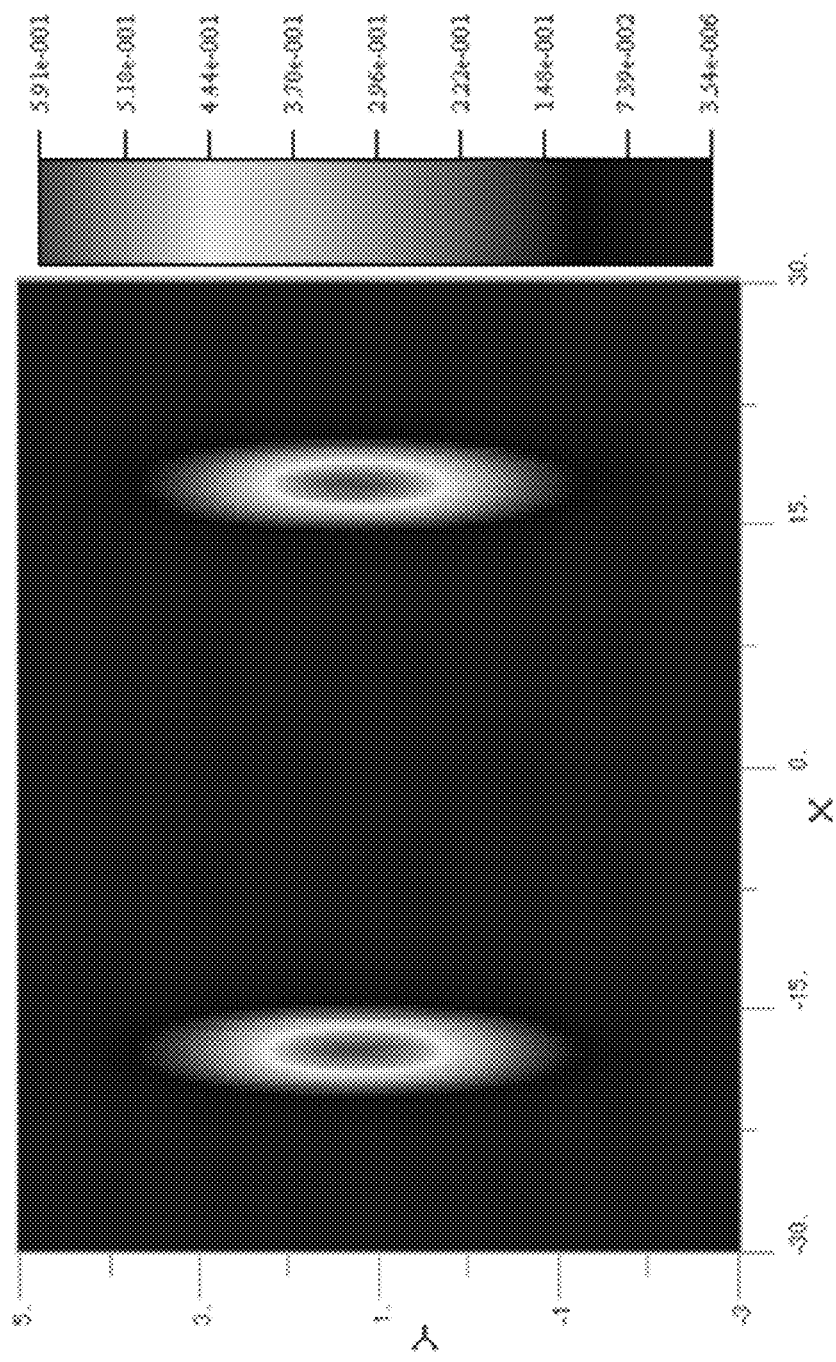
Figure 6C:
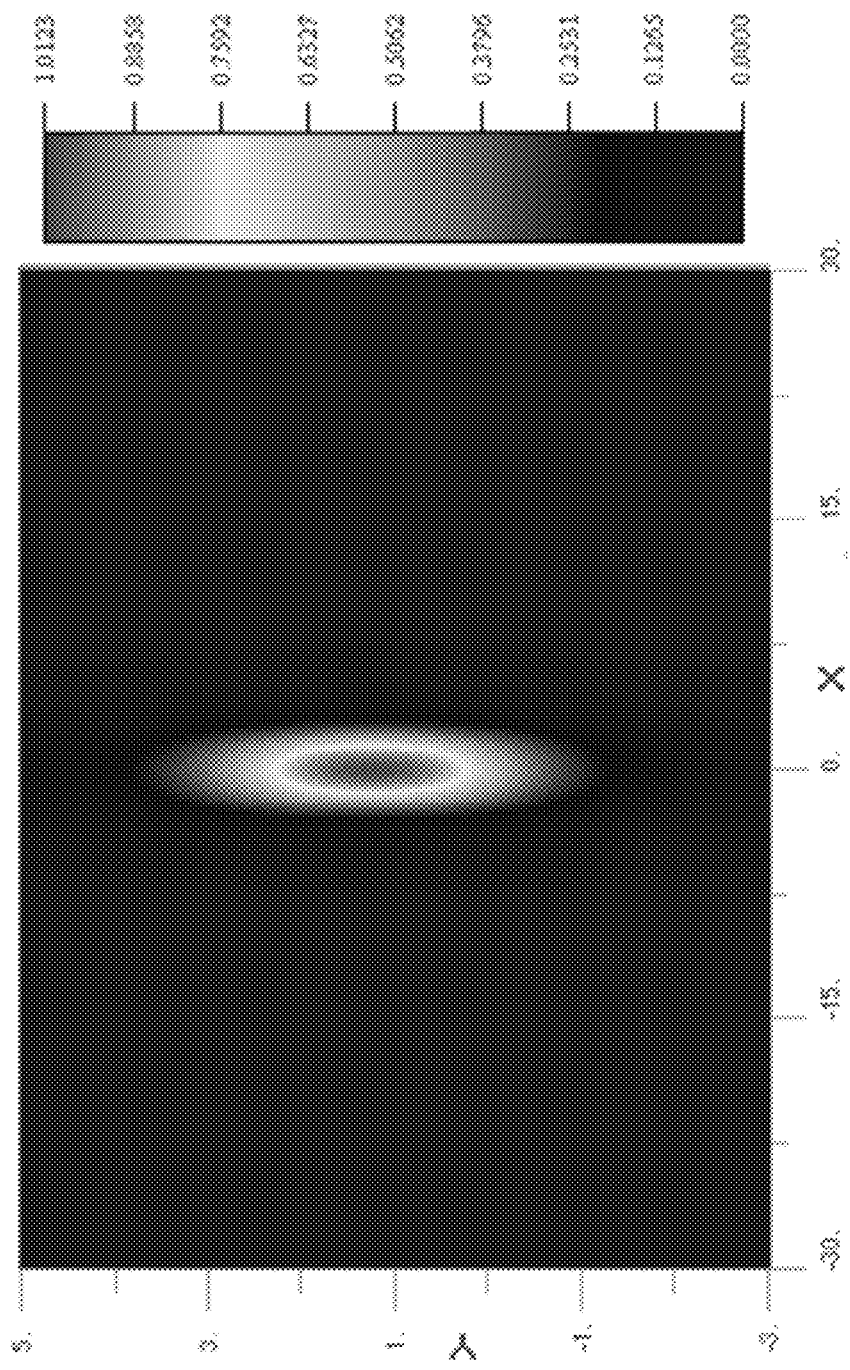
Figure 6D:
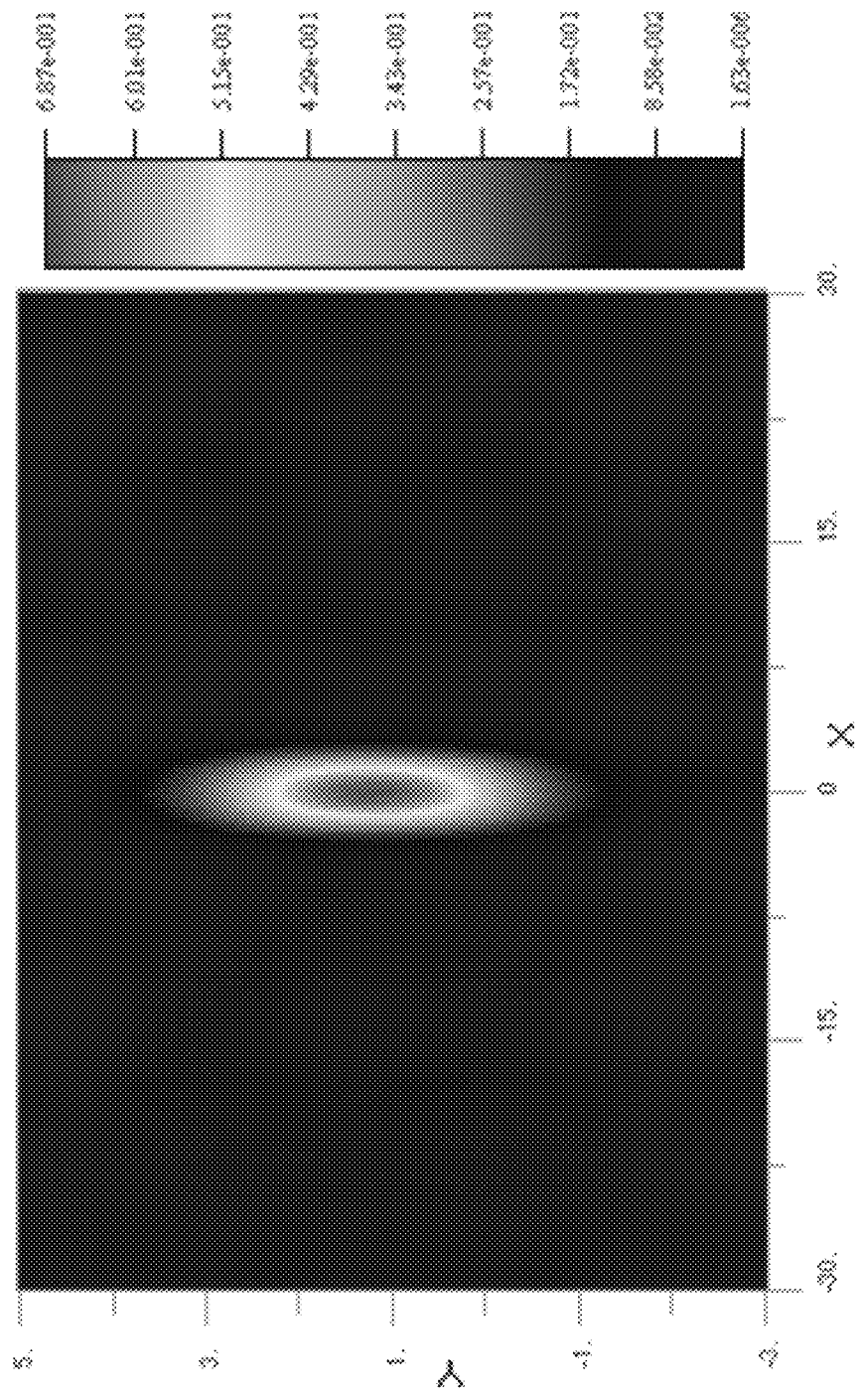

FIG. 5 depicts a graphical plotting of the quality factor (Q) of the above described optical fiber delay lines operating at about 10 GHz. These Q factor results are calculated for several fiber optic cable lengths having different attenuation factors, and optimum lengths are identified resulting in the highest predicted Q factor for the given fiber attenuation coefficient. Based on the results, it has been found that a fiber optic cable having an attenuation factor of about 0.2 dB/km achieves a maximum Q factor (i.e., energy storage to energy dissipation ratio in a cycle) when the fiber optic cable has a length of about 21.7 km. Accordingly, the optimum length of a fiber optic cable having an attenuation factor of about 0.2 dB/km is about 21.7 km. In such an example, a fiber optic cable having a Q factor of about 1.2E6 is obtained.

As described above, the output of the combiner network 232 may be fed back to the modulator 104 in order to achieve self-IL and self-PLL in the oscillator 100. The modulator may have a topology that is capable of be realized in an integrated fashion with the oscillator 100 on Si substrate using Si-Photonics. For example, the modulator 104 may be an optical Mach-Zhender modulator (MZM) having an MZM interferometer. Such a modulator is compatible with Si microelectronic steps and is suitable for metal-oxide field effect transistors (MOSFET), particularly for complementary MOSFET (C-MOS).

The MZM may be implemented using a combination of guest and host polymers with strong electro-optic (EO) properties ($r_{33}$>500 pm/V at wavelength of 1550 nm and even stronger 1150 pm/V at wavelengths of up to 1060 nm). The polymers may use standard realization or photonic bandgap structures as a slow wave structure. An EO polymer is based on a variety of stable polymers that are spun and poled on Si substrate to achieve desirable EO properties. The MZM may be implemented using nonlinear optical (NLO) chromophores doped polymer systems that exhibit ultrafast (e.g., pico-second) speeds with large electro optic coefficients (100 pm/V or greater) and low optical loss (1.5 dB/cm or less). A guest-host system may be formed using a physical mixture of chromophores and an EO polymer host.

In some aspects of disclosure, the EO polymer based MZM may be stabilized using control poling of an electric field between about 10V/μm to about 200V/μm, preferably between about 75V/μm to about 150V/μm. This may be combined with thermal and optically assisted poling processes at temperatures around 110 C. With electrical poling techniques performed at temperatures close to glass melt (i.e., around 110 C), polarization dipoles under a nitrogen rich environment can remain polarized as the temperature is gradually reduced. In some examples of disclosure, the control poling may involve lateral electrical poling. In other examples, it may involve transverse electrical poling.

Efficient integration of EO polymer based MZM with Si based voltage controlled oscillator and their associated control circuits are an important aspect of low cost and efficient manufacturing. The use of modulators having EO polymers (i.e., that are compatible with Si-Photonics) is preferable over the use of other insulator based modulators, such as Lithium Niobate (LiNbO3) based modulators. However, the length of the modulators must be carefully selected in order to cover a sufficient range of operation frequencies. As shown from the formula below, the maximum operation frequency, $f_{max}$, of the modulator is inversely related to its length L:

$$f_{max} = \frac{2c}{\pi |n_{eff} - \sqrt{\varepsilon_{eff}}| L}$$

where c is speed of light in free space, $n_{eff}$ is the effective optical index of refraction of the EO material, and $\varepsilon_{eff}$ is the effective RF permittivity of the EO material. Because of large difference between the effective index of refraction at optical and RF frequencies for LiNbO3, the maximum operating frequency of a modulator using such material is relatively limited. In contrast, NLO polymer systems have a relatively small difference between the effective index of refraction at optical and RF frequencies, and thus operate at a relatively greater maximum operating frequency.

Furthermore, a pinch-off voltage $V_\pi$ is required to be applied across one of the arms of the modulator in order to cause a 180 phase shift of the optical wave travelling through that arm (relative to the optical wave travelling through the other arm of the modulator), thereby effectively cutting the modulating signal through wave cancellation effects (i.e., destructive interference or destructive combination) in the Mach-Zehnder interferometer. This voltage $V_\pi$ can expressed as:

$$V_\pi = \frac{\lambda d}{n^3 r L \Gamma}$$

where λ is the wavelength of the optical wave, n is the index of refraction of the optical waveguide, r is EO coefficient, d is separation between the modulator electrodes, and Γ is the optical confinement factor. As seen from the above formula, a modulator having a greater EO coefficient (r) requires a lower voltage ($V_\pi$) to be applied in order to achieve the 180 phase shift. Because EO polymers have an r value of greater than about 100 pm/V (as opposed to LiNbO3 which have an r value of about 30 pm/V), the EO polymer based MZM requires a lower $V_\pi$. As a result, the EO polymer based modulator of the present disclosure, having a length of about 1 cm (in order to achieve greater maximum operating frequency, as described above) may achieve a 180 degree phase shift at a $V_\pi$ of as low as 0.5V, as compare to a $V_\pi$ of 5V obtained in a similarly dimensioned LiNbO3 MZM.

Further performance advantages of an EO polymer MZM, as compared to LiNbO3, are seen in simulations for modulators having a length of 1 cm. The design of an MZM is integrated with narrowband amplifiers to achieve a closed loop gain of unity. For an optical source power of 12 dBm at 1550 nm with relative intensity noise (RIN) value of −155 dB/Hz, a 30 dB amplifier is required for a modular LiNbO3 based system, with a system noise floor level of −133 dBm/Hz. By contrast, for an EO polymer based system, a 9 dB amplifier gain is sufficient, with a system noise floor level of −152 dBm/Hz. The table below further highlights the simulated performance advantages of using an EO polymer MZM, as compared to LiNbO3, where L=1 cm is considered for both topologies.

| EO Parameters | LiNbO3 | EO Polymer |
| --- | --- | --- |
| Electro-optic coefficient, r | 30 pm/V | 735 pm/V |
| $V_\pi$ for L = 1 cm length | 5 V | 0.5 V |
| Narrowband Amp Gain | 30 dB | 9 dB |
| Noise Floor | −133 dBm/Hz | −152 dBm/Hz |

In further examples, the modulator may be a poled polyimide having high EO coefficients from NLO chromophores, a high degree of chromophore dipole orientation, and a large r of 1250 pm/V at 1.3 μm. By modifying the electronic properties of the crosslinking reagents, the temperature window is optimized to achieve hardened materials with optimal properties. The guest-host EO polymers may have a low stabilization temperature since the chromophores are not attached to the polymer matrix and are free to rotate. Guest-host EO polymers are particularly useful in the evaluation of new chromophores because these polymers are easy to prepare and easy to pole.

FIG. 6 depicts a graphical intensity plot of an Si-photonics based Mach-Zhender modulator that is implemented using Si compatible electroptic (EO) polymer material. In FIG. 6, a transversely poled EO polymer based MZM is simulated in terms of transverse and longitudinal components of optical field in each leg of the ineterferometer as well as the input and output arms of the interferometer. Intensity values for various positions of the MZM are depicted in optical waveguide dimensions, in a range of a few micrometers in both the lateral and transverse directions. The electrical waveguide of the MZM may be a microstrip transmission line which may be monolithically integrated with the oscillator. The operating point of the MZM may be in quadrature or off points to generate a dominant fundamental harmonic or a dominant $2^{nd}$ harmonic.

Figure 7:
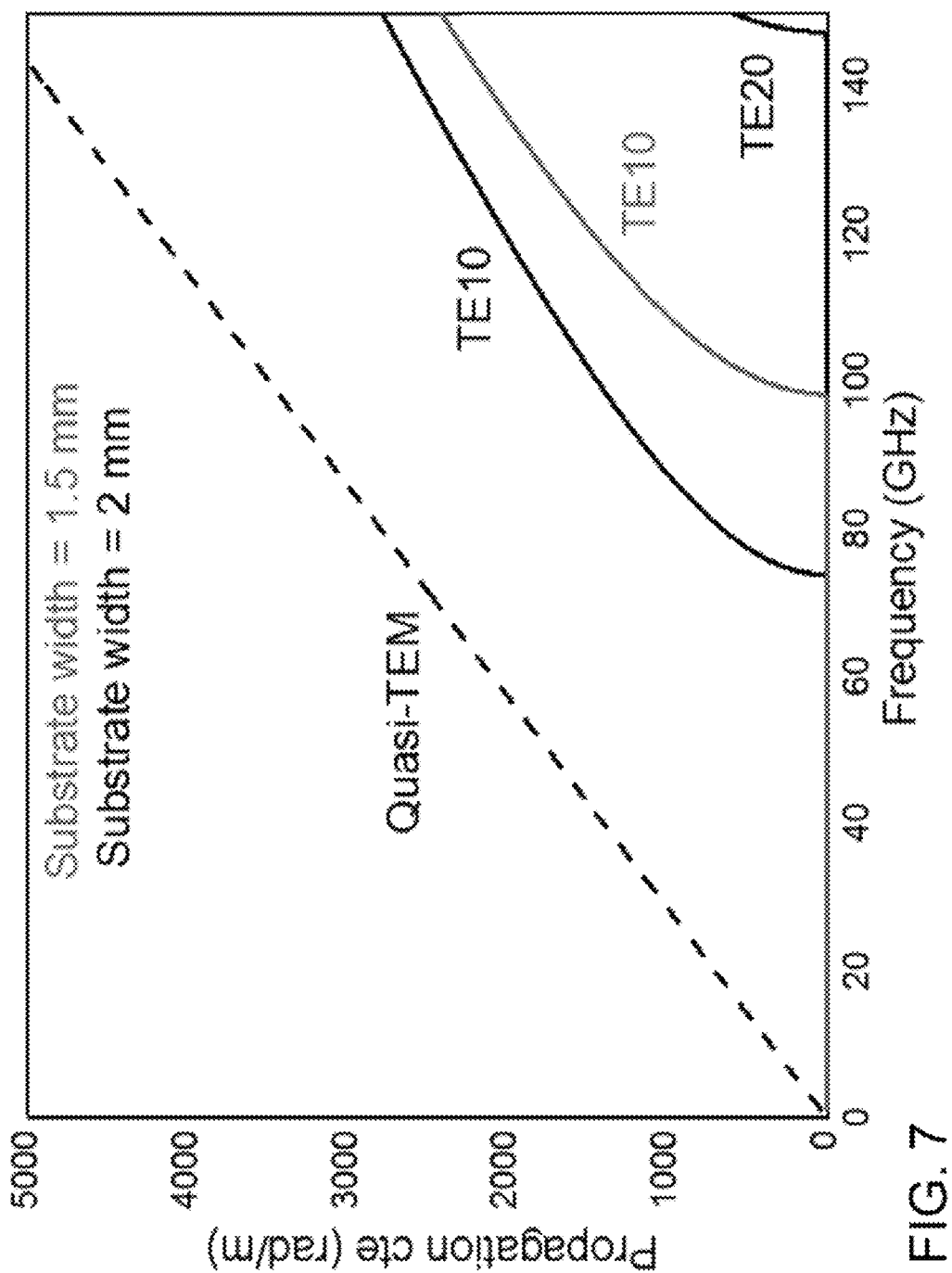
FIG. 7 is a data simulation of the operation characteristics for the modulator of FIG. 6 in accordance with an aspect of the disclosure.

FIG. 7 depicts operation characteristics for the integrated MZM design of FIG. 6 operating at 1550 nm with an EO coefficient of about 735 pm/V using a standard waveguide structure or a photonic bandgap as a slow wave structure. In the simulation results of FIG. 7, the microstrip line has a simulated single mode quasi-TEM operation of up to about 60 GHz for a substrate with a thickness of about 2 mm.

Monolithic integration of the above described OEO can be difficult in some additional respects. For example, while utilization of a long fiber optic delay line can yield significant gains in Q factor, the long delay can also cause very small mode spacing. In order for the multi-mode OEO system to function at a stable frequency, the OEO must be capable of suppressing side-modes with a low side-mode suppression ratio (SMSR). While use of additional electrical loops can improve SMSR, this can only make the mode spacing greater and the OEO will still be subject to frequency hopping, for example upon startup. While injection locking (e.g., an OEO coupled with a monolithic heterojunction phototransistor (HPT) oscillator, or an electrical oscillator) may mitigate these problems and yield a single mode output, such a design would result in a significant increase in cost.

Addressing the above concerns, a multi-mode injection-locking effect may be incorporated into the OEO system using a Fabry-Perot laser diode (FP-LD). Using the laser diode, a single OEO mode may be locked while other mismatched modes are suppressed due to the gain competing and phase-synchronization effect. This ensures that the oscillation frequency modulation frequency are synchronized in a single-mode operation, and further does not require the addition of any more high speed optoelectronic devices to the OEO system. The laser diode arrangement may lead to an SMSR of 75 dB or better.

Tunability of the OEO system is also a significant concern. Conventional OEOs generally have densely spaced oscillation modes due to the long length of fiber optic delay lines, and a fixed microwave bandpass filter (MBPF) having a relatively small frequency-tunable range (e.g., in the MHz range) must be used to ensure single-frequency oscillation. The present disclosure allows for use of a tunable MBPF implemented in the optical domain is incorporated in an OEO. One possible technique of frequency tuning may be performed by changing the wavelength of the incident light wave or the longitudinal modes of the FP-LD. Changing the wavelength is possible by changing the operating temperature, the current injection, and/or an external cavity length of a laser with an external cavity. However, temperature and current injection changes can often deteriorate the quality of a sustained microwave signal. Another possible frequency tuning technique may be performed using a two-port phase modulator (PM) and a linearly chirped fiber Bragg grating. The frequency tuning is realized by tuning the dispersion of the linearly chirped fiber Bragg grating. However, ensuring a large frequency-tunable range requires that the tunable range of the dispersion must be very large, which is hard to realize for practical applications.

A further concern is that the frequency of the generated microwave is usually low, being as that frequency is significantly limited by the bandwidth of the modulator and the central frequency of the MBPF. One could use two optical carriers at two different wavelengths instead of a single optical carrier. In such an arrangement, the MZM modulator may be biased at the quadrature point at one wavelength, to generate a fundamental oscillation, and at the minimum transmission point at the other wavelength, to generate a frequency-doubled operation. However, this arrangement is subject to poor stability due to drift. While a polarization modulator (PolM) may address the bias drifting issues, the frequency-doubling OEOs nonetheless require a fixed MPBF, which again leaves a relatively limited frequency-tunable range for the OEO system.

The above concerns may be addressed using a wideband tunable frequency-doubling OEO incorporating a photonic MBPF based on a PM and a phase shifted fiber Bragg grating (PS-FBG). The key benefits of such an OEO are that: (1) it is capable of generating a frequency-doubled microwave signal while using low-frequency components in the OEO loop, and that (2) it can realize wideband frequency tuning by simply tuning the wavelength of the incident light wave. In addition, no bias control is needed. This simplifies implementation and improves the operation stability. The PM and PS-FBG could be potentially integrated in a photonic integrated circuit chip, which would significantly improve its overall performance.

In an OEO system having a frequency shifter (FS), the oscillating frequency may be tuned by changing the optical pump wavelength. Compared to tunability of an OEO with an MZM, this arrangement may be capable of greater RF power output for a given amplifier gain and laser output.

The optical storage element of the OEO system is generally an optical fiber delay line. However, use of this storage element raises certain difficulties in operating the OEO system. For starters, the delay line can be relatively bulky and can make transportability of the OEO difficult. Further, the delay line would need to be temperature-stabilized, which would require a significant amount of power (e.g., in active temperature controllers). Lastly, the delay line is capable of generating spurious peaks very close to the carrier (few tens of kHz), which can be detrimental in several applications.

In light of these difficulties, in some examples, the optical fiber delay line may be replaced by an ultra-high Q whispering gallery-mode (WGM) optical resonator. The WGM optical resonator stores energy by trapping laser light while also defining the oscillation frequency (which is defined by the free spectral range of the resonator). OEOs using WGM technology are generally compact, do not generate delay-induced spurious peaks in the RF spectrum, and are compatible with compact temperature control systems. Thus, use of WGM technology can yield a portable OEO that is capable of producing an ultra-pure microwave signal. This is a highly desirable feature in many applications, such as in aerospace engineering, as long as any microphonics or stress/strain characteristics is properly addressed. This feature also permits for phase modulation, instead of intensity modulation, of the sustained signal. While intensity modulators are environment sensitive devices (which is not desired when high device stability is required, e.g., for pure tone generation), phase modulation involves a differential phase-to-intensity conversion, which is less sensitive to electro-optic drifts (e.g., slow charge re-distribution). Since the resonator is effectively an imbalanced interferometer, it is clearly useful for differential phase-to-intensity conversion. Like standard differential optical phase modulation techniques, the WGM optical resonator offers superior performances at very high modulation speeds (e.g., >10 Gb/s). Also, configuration of an ultra-high Q WGM optical resonator is compatible with chip integration, and therefore makes for a feasible and transportable source for ultra-pure microwave generation.

One benefit of the disclosed OEO system is that it can generate a very high frequency signal (e.g., 100 GHz). Generally, in order to generate such a high frequency signal, an OEO requires high frequency components (e.g., a 100 GHz photo-detector, a 100 GHz intensity modulator, a 100 GHz RF amplifier, etc.) which are generally expensive and difficult to implement. The OEO of the present disclosure is in fact capable of producing a high frequency signal using relatively low frequency optical and microwave devices. This aspect of the design can be modeled by a dual loop OEO operating at a low frequency using a directly modulated distributed feedback laser (DFB) laser. By injecting a continuous lightwave into the directly modulated DFB laser, and properly adjusting the injection power as well as the polarization, the laser diodes are injection locked, thereby generating higher harmonics. The harmonic order can be controlled by varying the frequency difference between the free running DFB laser and the continuous lightwave. Simulated data predicts that a 100 GHz microwave may be produced from an OEO having optical and electrical devices that operate at the frequency no more than 10 GHz.

A further benefit of the disclosed tunable OEO system is its relatively low phase noise. Phase noise performance of a tunable OEO is directly related to the fiber length, i.e., increasing the fiber length results in decreasing the phase noise of the OEO. However, an OEO generates multiple resonance frequencies with a mode spacing that is inversely proportional to the fiber length. Thus, increasing the fiber length also results in unwanted modes. Including an extremely narrow passband RF filter in the feedback loop of the OEO system can suppress the unwanted modes. Furthermore, the frequency selectivity of the RF filter may be relaxed by use of multi-loop configurations (e.g., additional optical loops, additional electrical loops). However, frequency tuning over a spectral range that is wider than the mode spacing of the longest feedback loop is hard to perform because any change of the frequency is directly related to a change of the loop length. An electrical phase shifter in conjunction with a standard high-pass filter in a dual-loop configuration may be used to make a tunable OEO with an ultra-wide tuning range that overcomes these difficulties.

In summary, the above described OEO system provides for a dramatic reduction in the size, weight, and power of a conventional OEO, using a platform that monolithically integrates photonics components (e.g., EO based MZM, photodiodes, Si Raman amplifier, etc.) and RF electronics in silicon (CMOS/BiCMOS/HBTs). Moreover, the disclosed OEO system provides a significant decrease in the RF power consumption of the integrated versus the discrete version of the OEO. While an OEO made of discrete components can include RF amplifiers that use as much as 10-20 W, the entire integrated RF chain of the disclosed OEO may use less than 200 mW. Even further, the integrated components are capable of operating from a less than 2 V power supply (e.g., an Si device) and do not need matching input and output drivers that discrete components generally require. Additionally, the modulator driver may typically use about 500 mW.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A monolithically integrated optoelectronic oscillation circuit for sustaining an oscillating optical signal, comprising:
   an injection locking circuit comprising at least one fiber optic delay line configured to receive a first portion of the optical signal;
   a phase lock loop circuit comprising at least two fiber optic delay lines configured to receive other portions of the optical signal;
   a monolithically integrated voltage controlled oscillator configured to generate a stable oscillating signal in response to each of an injection locking signal derived from the first portion of the optical signal and a phase lock loop signal derived from the other portions of the optical signal, the stable oscillating signal being configured to RF modulate the optical signal.

2. The optoelectronic oscillation circuit of claim 1, wherein at least one of the fiber optic delay lines is integrated in a mandrel having a diameter of about 1 inch or less.

3. The optoelectronic oscillation circuit of claim 2, wherein the mandrel is covered by a resin emulsion.

4. The optoelectronic oscillation circuit of claim 1, wherein the fiber optic delay line of the injection locking circuit has a length that is shorter than either of the fiber optic delay lines of the phase lock loop circuit.

5. The optoelectronic oscillation circuit of claim 1, further comprising at least one phase detector coupled to the at phase lock loop circuit and configured to determine a difference in phase between the respective signals propagating over each of the at least two fiber optic delay lines.

6. The optoelectronic oscillation circuit of claim 1, wherein the voltage controlled oscillator further comprises a resonator coupled to the injection locking circuit and configured to receive a processed signal derived from the first portion of the optical signal, wherein the resonator is further coupled to a pair of dynamically tuned resonators, each of the dynamically tuned resonators being coupled to respective fiber optic delay line of the phase lock loop circuit and configured to receive processed signals derived from the other portions of the optical signal.

7. The optoelectronic oscillation circuit of claim 6, wherein the resonator is capacitively coupled to each of the pair of dynamically tuned resonators.

8. The optoelectronic oscillation circuit of claim 6, wherein the resonator is a microstrip line resonator.

9. The optoelectronic oscillation circuit of claim 6, wherein the phase of the resonator is dynamically tuned by a phase tuning circuit that is coupled to each of the resonator and the dynamically tuned resonators.

10. The optoelectronic oscillation circuit of claim 6, wherein the resonator is a metamaterial evanescent mode combiner network.

11. An optoelectronic oscillator having monolithically integrated Si-Photonics structures, comprising:
    a modulator providing an optical signal;
    a first photodetector for converting a portion of the optical signal to an electrical signal, the first photodetector having an output that is coupled to a first amplifier;
    an optical filter for receiving a portion of the optical signal, the optical filter having an output that is coupled to a second photodetector for converting a portion of the optical signal to an electrical signal, the second photodetector having an output that is coupled to a second amplifier;
    a third photodetector for converting a portion of the optical signal to an electrical signal, the third photodetector having an output that is coupled to a third amplifier;
    a phase detector for receiving a first RF signal from the first amplifier and a second RF signal from the second amplifier with a longer delay than the first RF signal, the phase detector configured to determine a phase difference between the first and second RF signals; and
    a voltage controlled oscillator for receiving a third RF signal from the third amplifier, and for receiving an electrical signal from the phase detector, wherein the voltage controlled oscillator is configured to output an oscillating signal in response to each of the electrical signal from the phase detector and the third RF signal, and wherein the oscillating signal is used to control an output of the modulator,
    wherein each of the modulator, photodetectors, amplifiers, optical filter, phase detector, and voltage controlled oscillator are formed on an integrated circuit.

12. The optoelectronic oscillator of claim 11, wherein the modulator is an optical Mach-Zehnder modulator comprising an electro-optic polymer.

13. The optoelectronic oscillator of claim 12, wherein the optical Mach-Zehnder modulator comprises a mixture of chromophores and an electro-optic polymer.

14. The optoelectronic oscillator of claim 12, wherein the modulator exhibits an electro-optic coefficient of about 100 pm/V or greater at a wavelength of 1550 nm.

15. The optoelectronic oscillator of claim 14, wherein the modulator is integrated with a photonic bandgap structure.

16. The optoelectronic oscillator of claim 12, wherein the modulator exhibits an electro-optic coefficient of about 1150 pm/V at a wavelength of 1060 nm.

17. The optoelectronic oscillator of claim 12, wherein the modulator exhibits an optical loss of about 1.5 dB/cm or less.

18. The optoelectronic oscillator of claim 12, wherein the modulator exhibits a pinch-off voltage of about 0.5V or less.

19. The optoelectronic oscillator of claim 12, wherein the modulator is configured to be laterally poled or transversely poled using an electric field between about 10V/μm and about 200V/μm.

20. The optoelectronic oscillator of claim 19, wherein the modulator is configured to be poled at a temperature of about 110 C.

21. The optoelectronic oscillator of claim 12, wherein the modulator is a microstrip line in a substrate having a thickness of about 2 mm or more, the modulator having a single mode quasi-TEM operation of up to about 60 GHz.

22. The optoelectronic oscillator of claim 11, wherein the optical filter comprises a Fabry-Perot laser diode that is capable of suppressing sidemodes of the portion of the optical signal received by the optical filter at a ratio of at least 75 dB.

23. The optoelectronic oscillator of claim 11, further comprising a tunable phase-shifted fiber Bragg grating and a phase modulator, both integrated in the integrated circuit.

24. The optoelectronic oscillator of claim 11, wherein the modulator comprises a frequency shifter capable of tuning the oscillating frequency of the oscillator by changing an optical pump wavelength.

25. The optoelectronic oscillator of claim 11, further comprising a whispering gallery-mode resonator.

26. The optoelectronic oscillator of claim 11, wherein the power consumption of the RF components of said oscillator is about 200 mW or less, and the modulator is driven using about 500 mW or less.

27. The optoelectronic oscillator of claim 11, wherein said oscillator is capable of being operating by a power supply having a voltage of about 2 volts or less.

28. The optoelectronic oscillator of claim 11, wherein said second photodetector comprises a high-power handling photodiode.

29. The optoelectronic oscillator of claim 11, comprising an InGaAsP/InP based optical source, an electrocabsorption modulator, an optical amplifier, and a phase shifter.

* * * * *